United States Patent
Park et al.

(10) Patent No.: US 9,812,602 B2
(45) Date of Patent: *Nov. 7, 2017

(54) LIGHT DETECTION DEVICE

(71) Applicant: Seoul Viosys Co., Ltd., Ansan-si (KR)

(72) Inventors: Ki Yon Park, Ansan-si (KR); Hwa Mok Kim, Ansan-si (KR); Young Hwan Son, Ansan-si (KR); Daewoong Suh, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/860,653

(22) Filed: Sep. 21, 2015

(65) Prior Publication Data

US 2016/0013351 A1 Jan. 14, 2016
US 2017/0244000 A9 Aug. 24, 2017

Related U.S. Application Data

(63) Continuation-in-part of application No. 14/140,054, filed on Dec. 24, 2013, now Pat. No. 9,171,976, and
(Continued)

(30) Foreign Application Priority Data

Dec. 20, 2012 (KR) .................. 10-2012-0157424
Dec. 27, 2012 (KR) .................. 10-2012-0155413
Jan. 21, 2013 (KR) .................. 10-2013-0006274

(51) Int. Cl.
*H01L 29/15* (2006.01)
*H01L 31/102* (2006.01)
(Continued)

(52) U.S. Cl.
CPC ........ *H01L 31/108* (2013.01); *H01L 31/0224* (2013.01); *H01L 31/022408* (2013.01);
(Continued)

(58) Field of Classification Search
CPC .............. H01L 31/108; H01L 31/0224; H01L 31/022475; H01L 31/03048; H01L 31/109; H01L 31/1848; Y02E 10/544
(Continued)

(56) References Cited

U.S. PATENT DOCUMENTS 6,104,074 A  8/2000 Chen
6,137,123 A  10/2000 Yang et al.
(Continued)

FOREIGN PATENT DOCUMENTS

CN  100470864 C  3/2009
JP  2003142721 A  5/2003
(Continued)

OTHER PUBLICATIONS

Ko et al., "AlGaN/GaN Schottky-barrier UV-B bandpass photodetectors with ITO contacts and LT-GaN cap layers", Sci. Technol. 21, 2006, pp. 1064-1068.
(Continued)

*Primary Examiner* — Dzung Tran
(74) *Attorney, Agent, or Firm* — Perkins Coie LLP

(57) ABSTRACT

A light detection device includes a substrate, a buffer layer disposed on the substrate, a first band gap change layer disposed on a portion of the buffer layer, a light absorption layer disposed on the first band gap change layer, a Schottky layer disposed on a portion of the light absorption layer, and a first electrode layer disposed on a portion of the Schottky layer.

16 Claims, 25 Drawing Sheets

Related U.S. Application Data a continuation-in-part of application No. 14/692,041, filed on Apr. 21, 2015, now Pat. No. 9,166,093, which is a continuation of application No. 14/140,086, filed on Dec. 24, 2013, now Pat. No. 9,059,359.

(51) Int. Cl.
  *H01L 27/146* (2006.01)
  *H01L 31/108* (2006.01)
  *H01L 31/0304* (2006.01)
  *H01L 31/0224* (2006.01)
  *H01L 31/18* (2006.01)
  *H01L 31/101* (2006.01)

(52) U.S. Cl.
  CPC .... *H01L 31/03048* (2013.01); *H01L 31/1013* (2013.01); *H01L 31/1848* (2013.01); *Y02E 10/544* (2013.01)

(58) Field of Classification Search
  USPC .............................. 257/76, 448, 185; 438/172
  See application file for complete search history.

(56) References Cited

U.S. PATENT DOCUMENTS

| | | | |
|---|---|---|---|
| 7,638,809 B2 | 12/2009 | Ohba | |
| 2003/0160231 A1 | 8/2003 | Cole et al. | |
| 2004/0089859 A1 | 5/2004 | Shirakawa et al. | |
| 2006/0108528 A1* | 5/2006 | Qiu | B82Y 20/00 250/338.4 |
| 2006/0273325 A1 | 12/2006 | Surya | |
| 2007/0034883 A1* | 2/2007 | Ohba | H01L 33/08 257/85 |
| 2008/0087914 A1 | 4/2008 | Li et al. | |
| 2009/0008648 A1* | 1/2009 | Biwa | H01L 33/025 257/76 |
| 2009/0269867 A1 | 10/2009 | Shakuda | |
| 2010/0051962 A1* | 3/2010 | Kikkawa | H01L 21/0237 257/76 |
| 2010/0078656 A1* | 4/2010 | Seo | H01L 27/156 257/88 |
| 2011/0049566 A1 | 3/2011 | Perera et al. | |
| 2011/0073907 A1 | 3/2011 | Enicks et al. | |
| 2012/0104535 A1 | 5/2012 | Kawakami et al. | |
| 2012/0133956 A1 | 5/2012 | Findlay et al. | |
| 2013/0292687 A1* | 11/2013 | Jiang | H01L 31/03048 257/76 |
| 2014/0023102 A1* | 1/2014 | Holder | H01S 5/1039 372/44.01 |
| 2014/0374771 A1* | 12/2014 | Umeno | H01L 29/201 257/76 |

FOREIGN PATENT DOCUMENTS

| | | |
|---|---|---|
| JP | 2005235909 A | 9/2005 |
| KR | 1020070106214 | 11/2007 |
| WO | 2011124593 A1 | 10/2011 |

OTHER PUBLICATIONS

Kim, Do Weon, Authorized Officer, Korean Intellectual Property Office, International Search Report, International Application No. PCT/KR2013/012143, dated Apr. 29, 2014, 3 pages.

C. Miao et al., "InGaN/GaN multi-quantum-well-based light-emitting and photodetective dual-functional devices," Front. Optoelectron. China, 2009, vol. 2(4), pp. 442-445 (published online; Sep. 23, 2009).

Office Action in Korean Application No. 10-2012-0157424, dated Jul. 19, 2017.

\* cited by examiner

LIGHT DETECTION DEVICE

PRIORITY CLAIMS AND CROSS-REFERENCE TO RELATED APPLICATIONS

This patent document is a continuation-in-part application of co-pending U.S. patent application Ser. No. 14/140,054 entitled "light detection device" and filed on Dec. 24, 2013, which was published as U.S. Patent Application Publication No. 20140183548 on Jul. 3, 2014. The U.S. patent application Ser. No. 14/140,054 claims priority to Korean Patent Application No. 10-2012-0157424, filed on Dec. 28, 2012. The entire disclosures of the above applications are incorporated herein by reference in their entirety as part of this document.

TECHNICAL FIELD

Exemplary embodiments of the disclosed technology relate to a light detection device. Some implementations of the disclosed technology relate to a light detection device that reduces current flow resistance due to an abrupt energy band gap change between a buffer layer and a light absorption layer, through an application of a multilayer band gap change layer having different energy band gaps.

BACKGROUND

Ultraviolet (UV) light has a shorter wavelength than the visible light, and was discovered for the first time by the German Chemist, J. W. Ritter, in 1801.

Here, UV radiation is defined as electromagnetic waves with a broad spectrum of wavelengths of about 397 to 10 nm, and the UV radiation with extremely short wavelength does not get distinguished easily with X-rays. Further, since the UV radiation is characterized by powerful chemical reactions, it is also called actinic rays, while infrared radiation is called heat rays.

The UV radiation with the wavelength of 400 nm or less is divided into several bands by wavelengths—UVA, UVB, and UVC. UVA measures 320 to 400 nm, corresponds to about 98% or more of sunlight that reaches the earth's surface, and negatively affects human skin, such as melanism or premature skin aging. UVB measures 280 to 320 nm, corresponds to about 2% of sunlight that reaches the earth's surface, and severely affects the human body, such as by causing skin cancers, cataracts, or erythema phenomenon. The UVB radiation is mostly absorbed by the ozone layer. However, due to destruction of the ozone layer, the amount of UVB radiation that reaches the earth's surface has been increased in many areas, and this causes severe environmental problems. UVC measures 200 to 280 nm, is all absorbed in the atmosphere, and thus, scarcely reaches the earth's surface. The UVC is mainly used for bacteriocidal action. The representative quantification of UV radiation influence exerted on the human body is the UV index that is defined as the incident level of UVB radiation.

A device that can sense the UV light may be a PMT (Photo Multiplier Tube) or a semiconductor device. Since the semiconductor device is cheaper and smaller than the PMT, it has widely been used. In the semiconductor device, GaN (Gallium Nitride) or SiC (Silicon Carbide) having an energy band gap that is suitable to UV sensing, is widely used.

Particularly, in the case of a device based on GaN, a Schottky junction type, MSM (Metal-Semiconductor-Metal) type, or PIN type device has been mainly used. In particular, the Schottky junction type device is generally preferred since its fabricating process is simple.

SUMMARY

Some embodiments of the disclosed technology is directed to a light detection device that improves current flow prevention according to an abrupt energy band gap change of a buffer layer and a light absorption layer through application of a multilayer band gap change layer having different energy band gaps.

Some embodiments of the disclosed technology is directed to a light detection device that uses ITO or the like as a Schottky layer to improve permeability of light to be especially detected.

Some embodiments of the disclosed technology is directed to a light detection device in which a top layer composed of p-In$_z$Ga1-zN (0<z<1), which is doped with Mg, is inserted into a bottom surface of a Schottky layer to facilitate Schottky characteristics of the Schottky layer.

Some embodiments of the disclosed technology is directed to a light detection device in which a part of a Schottky layer and a part of a top layer are simultaneously contacted and fixed to each other by a Schottky fixing layer to prevent peeling of the Schottky layer due to stress during wire bonding.

Some embodiments of the disclosed technology provide a photo detection device capable of detecting different wavelength regions of two or more regions using one device, obtaining an accurate reactivity value according to a wavelength, and having high reliability by forming a plurality of light absorption layers capable of detecting different wavelength regions in the one device and forming a first electrode layer on each of the plurality of light absorption layers so that the plurality of light absorption layers can operate individually, and a photo detection package including the photo detection device.

Some embodiments of the disclosed technology also provides a photo detection package capable of a light detection function and a light dissipation function and capable of securing reliability by monitoring whether or not a photo detection device and an LED normally operate, and a portable device including the photo detection package.

In one aspect, a light detection device is provided to comprise: a substrate; a buffer layer disposed over the substrate; a first band gap change layer disposed over a portion of the buffer layer; a light absorption layer disposed over the first band gap change layer; a Schottky layer disposed over a portion of the light absorption layer; wherein the buffer layer and the light absorption layer have different energy band gaps from each other and the first band gap change layer has at least two energy band gaps between the energy band gaps of the buffer layer and the light absorption layer.

In some implementations, the light detection device further comprises a top layer disposed between the light absorption layer and the Schottky layer. In some implementations, the light detection device further comprises a Schottky fixing layer disposed over the Schottky layer to cover the Schottky layer. In some implementations, the Schottky layer comprises ITO, ATO, Pt, W, Ti, Pd, Ru, Cr, or Au and the Schottky fixing layer comprises ITO, ATO, Pt, W, Ti, Pd, Ru, Cr, or Au. In some implementations, the light detection device further comprises: a first electrode layer disposed over the Schottky fixing layer; and a second electrode layer disposed on the buffer layer and spaced apart from the first band gap change layer, the second electrode layer configured to form an Ohmic junction with the buffer layer.

In some implementations, the substrate comprises a sapphire substrate, an SiC substrate, a GaN substrate, an AlN substrate, or an Si substrate. In some implementations, the buffer layer comprises a low-temperature GaN layer disposed over the substrate and a high-temperature GaN layer disposed over the low-temperature GaN layer. In some implementations, the layers of the first band gap change layer have an increasing energy band gap towards the light absorption layer. In some implementations, the layers of the first band gap change layer comprises AlGaN layers having different Al contents. In some implementations, the light absorption layer has an energy band gap higher than that of the buffer layer. In some implementations, the light absorption layer comprises $Al_xGa_{1-x}N$ (0<x<0.7) or $In_yGa_{1-y}N$ (0<y<0.5). In some implementations, the first band gap change layer comprises InGaN layers having different In contents. In some implementations, the first band gap change layer has a thickness between 0 and 50 nm. In some implementations, the light absorption layer has a thickness between 0.1 to 0.5 μm.

In another aspect, a light detection device is provided to comprise: a substrate; a buffer layer disposed over the substrate; a first band gap change layer disposed over the buffer layer and having an increasing energy band gap as being away from the buffer layer; a light absorption layer disposed over the first band gap change layer; a second band gap change layer disposed over the light absorption layer and having a decreasing energy band gap as being away from the light absorption layer; and a Schottky layer disposed over the second band gap change layer.

In some implementations, the first band gap change layer and the second band gap change layer comprise AlGaN layers having different Al contents. In some implementations, the first band gap change layer and the second band gap change layer comprise InGaN layers having different In contents. In some implementations, the light detection device further comprises: a top layer disposed between the light absorption layer and the Schottky layer and having an energy band gap lower than that of the light absorption layer and higher than an energy band gap of the light absorption layer. In some implementations, the light absorption layer comprises $In_yGa_{1-y}N$ (0<y<0.5). In some implementations, the first band gap change layer has a thickness between 0 and 50 nm, the light absorption layer has a thickness between 0.1 to 0.5 μm, and the second band gap change layer has a thickness between 0 and 20 nm.

In accordance with another aspect of the disclosed technology, a light detection device is provided to include a substrate; a buffer layer formed on the substrate; a first band gap change layer formed on a portion of the buffer layer; a light absorption layer formed on the first band gap change layer; a Schottky layer formed on a portion of the light absorption layer; and a first electrode layer formed on a portion of the Schottky layer.

This document further provides additional technical features, including features disclosed in U.S. Pat. No. 9,059,359 entitled "Photo detection device, photo detection package including the photo detection device, and portable device including the photo detection package". For example, a photo detection device is provided to include a substrate, a first light absorption layer disposed on the substrate, a second light absorption layer disposed in a first region on the first light absorption layer, and a first electrode layer disposed on each of the first and the second light absorption layers.

In accordance with some implementations of the disclosed technology, the multilayer band gap change layer having different energy band gaps is formed between the buffer layer and the light absorption layer. Accordingly, the current flow prevention according to the abrupt energy band gap change of the buffer layer and the light absorption layer is improved, the crystalline characteristics of the light absorption layer are improved, and thus the reliability of the light detection device is improved.

Further, since the multilayer band gap change layer having different energy band gaps is formed between the light absorption layer and the top layer, the current flow prevention according to the abrupt energy band gap change of the light absorption layer and the top layer is improved, the crystalline characteristics of the top layer are improved, and thus the reliability of the light detection device is improved.

Further, since the Schottky layer is made of ITO having superior light permeability as compared with Ni in the related art, the degree of reaction of the light detection device is improved.

Further, the top layer composed of $p-In_zGa_{1-z}N$ (0<z<1) is formed on the bottom surface of the Schottky layer to facilitate the formation of the Schottky junction between the Schottky layer and the top layer, and the parts of the Schottky layer and the top layer are simultaneously contacted and fixed to each other through the Schottky fixing layer to overcome the stress by the wire bonding. Accordingly, the peeling phenomenon of the Schottky layer is prevented, and thus the production yield of the light detection device is improved.

DETAILED DESCRIPTION

Figure 1:
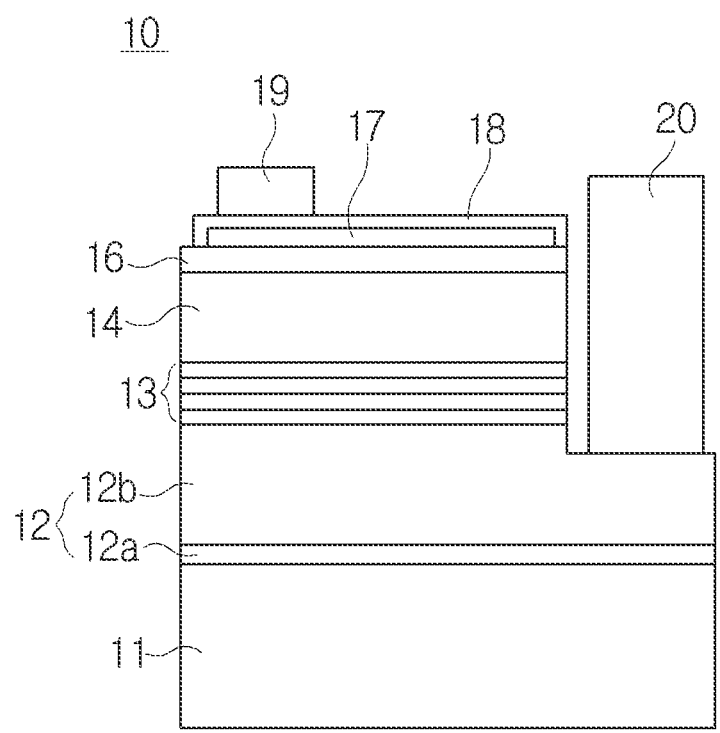
FIG. 1 is a cross-sectional view of a light detection device in accordance with an exemplary embodiment of the disclosed technology.

Various implementations of the disclosed technology provide a light detection device, photo detection device, photo detection package including the photo detection device, and portable device including the photo detection package.

Some implementations of the disclosed technology provide a light detection device that reduces current flow resistance due to an abrupt energy band gap change between a buffer layer and a light absorption layer, through an application of a multilayer band gap change layer having different energy band gaps.

In the Schottky junction type device, a buffer layer, a light absorption layer, and a Schottky junction layer are laminated in order on different substrates, a first electrode is formed on the buffer layer or the light absorption layer, and a second electrode is formed on the Schottky junction layer. In this case, the buffer layer may be formed of a GaN layer, and the light absorption layer may be formed of an AlGaN layer. However, if the Al content of the AlGaN layer is equal to or higher than 15%, and the thickness thereof is equal to or larger than 0.1 μm, cracks may be produced due to differences in lattice mismatch and thermal expansion coefficient between the GaN layer and the AlGaN layer, thereby reducing yields.

In order to solve this, an AlN buffer layer may be used between the GaN buffer layer and the AlGaN light absorption layer. In the case of using the AlN buffer layer, a light detection reaction is reduced, due to the high energy band gap and insulating properties of the AlN layer. Further, in the case of using the AlGaN layer as the light absorption layer, it is difficult to form an ohmic junction directly on the AlGaN layer, due to high contact resistance, if the Al content is equal to or higher than 15%. It is also not possible to obtain uniform Schottky junction characteristics due to high Schottky junction barrier. In addition, if the thickness of the light absorption layer is set to 0.1 μm or less to prevent the cracks, the light absorption efficiency is deteriorated due to the thin thickness of the light absorption layer, and thus, the reaction thereof is also reduced.

Under the recognition above, exemplary embodiments of the disclosed technology will be described below in more detail with reference to the accompanying drawings. The drawings are not necessarily to scale and in some instances, proportions may have been exaggerated in order to clearly illustrate features of the embodiments.

Further, the following terms are defined considering functions of the disclosed technology, and may be differently defined according to the intention of a user or an operator or custom. Therefore, the terms should be defined based on the overall contents of the specification.

For example, when a first layer is referred to as being "on" a second layer or "on" a substrate, it not only refers to a case where the first layer is formed directly on the second layer or the substrate but also a case where a third layer exists between the first layer and the second layer or the substrate. It will be understood that when an element or layer is referred to as being "connected to" another element or layer, it can be directly connected to the other element or layer, or intervening elements or layers may be present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The disclosed technology may, however, be embodied in different forms and should not be construed as limited to the embodiments set forth herein. Rather, these embodiments are provided so that this disclosure will be thorough and complete, and will fully convey the scope of the disclosed technology to those skilled in the art. Throughout the disclosure, like reference numerals refer to like parts throughout the various figures and embodiments of the disclosed technology.

In the following embodiments, detection of ultraviolet light is specially described. However, the disclosed technology may also be used for light detection in other wavelength regions.

Figure 2:
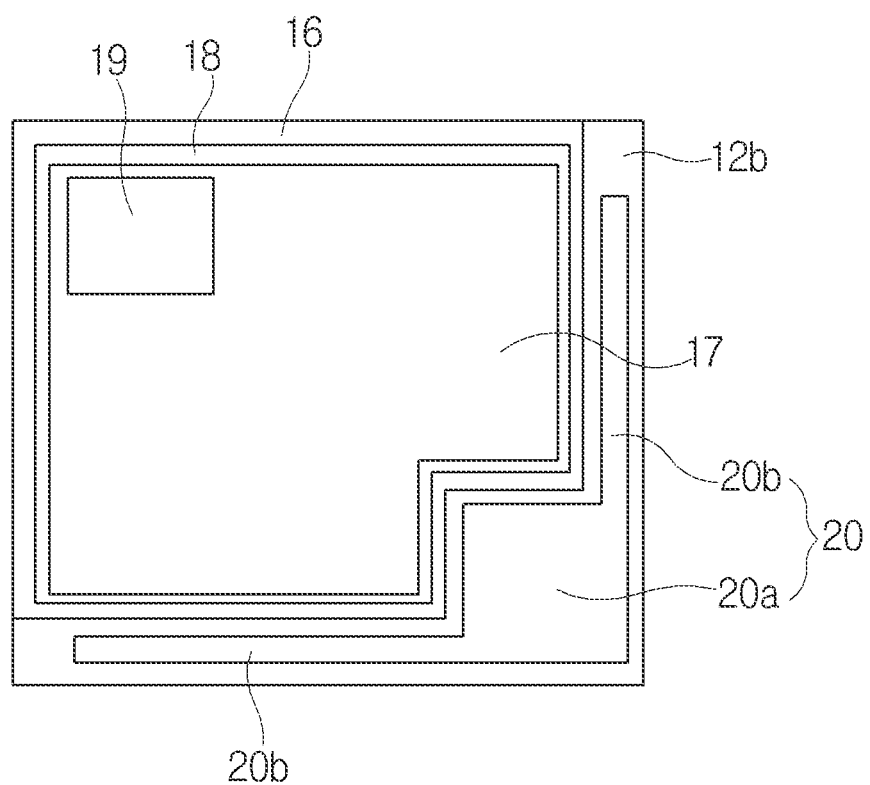
FIG. 2 is a plan view of the light detection device of FIG. 1.
Figure 3:
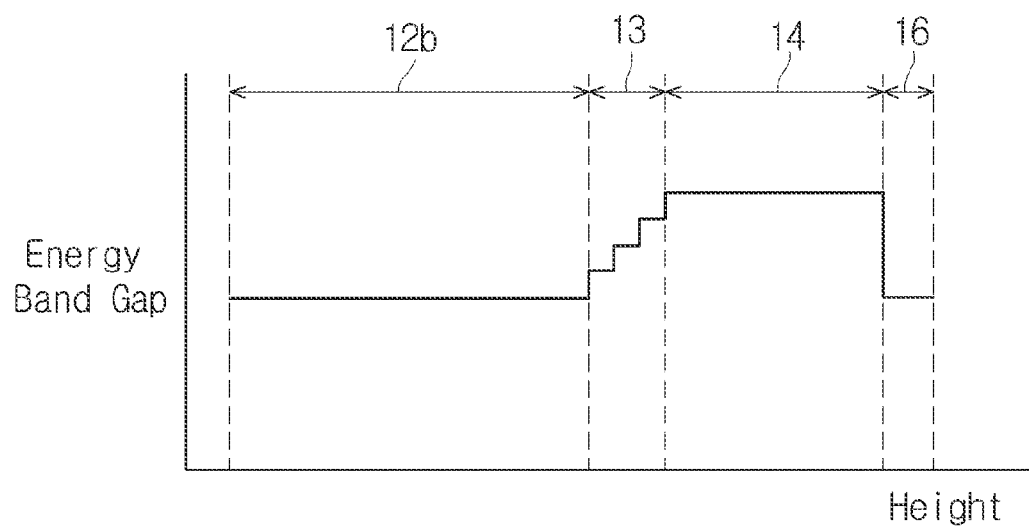
FIG. 3 is a diagram illustrating an energy band of the light detection device of FIG. 1.

FIG. 1 is a cross-sectional view of a light detection device 10, in accordance with an exemplary embodiment of the disclosed technology, and FIG. 2 is a plan view of the light detection device 1. FIG. 3 is a diagram illustrating an energy band of the light detection device 1.

As illustrated in FIG. 1, the light detection device 10 includes a buffer layer 12 formed on a substrate 11, a first band gap change layer 13 formed on a portion of the buffer layer 12, a light absorption layer 14 formed on the first band gap change layer 13, and a top layer 16 formed on the light absorption layer 14.

A Schottky layer 17 is formed on a portion of the top layer 16, and a Schottky fixing layer 18 is formed on the Schottky layer 17. As illustrated in FIGS. 1 and 3, the Schottky fixing layer 18 is wider than the Schottky layer 17, so as to contact a part of the top layer 16 exposed outside of the Schottky layer 17, along a border of the Schottky layer 17.

A first electrode layer 19 is formed on a portion of the Schottky fixing layer 18. A second electrode layer 20 is formed on the buffer layer 12 to be spaced apart from the first band gap change layer 13.

The substrate 11 may be made using sapphire, AlN, SiC, GaN, or Si. The buffer layer 12 includes a low-temperature GaN layer 12a formed on the substrate 11 and a high-temperature GaN layer 12b formed on the low-temperature GaN layer 12a.

When forming the light detection device 10, the substrate 11 is positioned on a susceptor of a reaction tube of a metal organic chemical vapor deposition (MOCVD) device. The pressure in the reaction tube is lowered to 100 torr or less to remove impure gas in the reaction tube.

The surface of the substrate 11 is thermally cleaned by increasing the temperature up to 1100° C. while maintaining the internal pressure of the reaction tube at 100 torr. Then, the temperature is lowered to 550° C., and the low-temperature GaN layer 12a is grown by making Ga source and ammonium (NH3) gas flow to the reaction tube. At this time, the overall gas flow in the reaction tube is determined by the flow rate of hydrogen (H2) gas used as a carrier.

In order to secure the crystalline and optical and electrical characteristics of the high-temperature GaN layer 12b that is grown on the low-temperature GaN layer 12a, the low-temperature GaN layer 12a is generally formed with a thickness of at least 25 nm.

After the low-temperature GaN layer 12a is grown, the temperature of the susceptor is increased up to 1000 to 1100° C., for example, 1050° C., to grow the high-temperature GaN layer 12b. At this time, if the temperature is lower than 1000° C., the optical, electrical, and crystalline characteristics of the high-temperature GaN layer 12b are degraded. If the temperature exceeds 1100° C., the surface roughness is increased, lowering the crystallinity of the high-temperature GaN layer 12b.

The thickness of the high-temperature GaN layer 12b is generally about 2 μm. Although the high-temperature GaN layer 12b shows the n-type characteristics even if doping is not performed, Si doping may be performed for the n-type effect.

The light absorption layer 14 is grown on the high-temperature GaN layer 12b. In order for the light absorption layer 14 to operate as a UVB detection and absorption layer, the light absorption layer 14 should have Al content of 15% or more, and a thickness of 0.1 μm or more.

During the growing under the above-described conditions, due to lattice mismatch and thermal expansion coefficient differences between the light absorption layer 14 and the high-temperature GaN layer 12b, cracks may be produced. This may cause the characteristics and the yield to be degraded.

Accordingly, a high-temperature AlN buffer layer may be formed between the high-temperature GaN layer 12b and the light absorption layer 14, at about 1050° C. The high-temperature AlN buffer layer may suppress cracking. However, the AlN buffer layer becomes nearly an insulating layer, since the energy band gap of the AlN buffer layer is high, that is, about 6 eV. Accordingly, it is difficult to obtain high-quality crystallinity, and the insulating characteristics of the AlN buffer layer may disturb fine current flow.

In order to solve this and/or other problems, the first band gap change layer 13 is formed between the high-temperature GaN layer 12b and the light absorption layer 14. At this time, the first band gap change layer 13 is grown under the same conditions as the growing conditions of the high-temperature GaN layer 12b.

The first band gap change layer 13 may be composed of multiple layers having different Al contents. The first band gap change layer 13 may be formed through lamination of a plurality of AlGaN layers having different Al contents, or may be formed through alternate lamination of a plurality of AlGaN layers having different Al contents and GaN layers. In the case of the light detection device 10, the first band gap change layer 13 may be formed through lamination of a plurality of AlGaN layers having different Al contents.

In this case, in order to minimize the reduction of current flow, due to light energy that is absorbed in the light absorption layer 14, the overall thickness of the first band gap change layer 13 may be equal to or smaller than 50 nm, and the multiple layers that constitute the first band gap change layer 13 may have the same thickness. However, the multiple layers may have different thicknesses, and the number of layers and the thicknesses of the respective layers may be selectively determined, as needed.

After the first band gap change layer 13 is grown, the light absorption layer 14 that is formed of an $Al_xGa_{1-x}N$ (0<x<0.7) layer is grown. That is, an AlGaN layer is formed by supplying an Al source under the growing conditions of the high-temperature GaN layer 12b, and the formed AlGaN layer operates as the light absorption layer 14.

The light absorption layer 14 is grown with a thickness of 0.1 to 0.5 μm. For example, the light absorption layer 14 may have a thickness of about 0.2 μm, in consideration of the influence of cracks or the like.

Further, the energy band gap of the light absorption layer 14 may differ, depending on the wavelength region of light to be absorbed. The light absorption layer 14 having a desired energy band gap can be selectively grown through proper adjustment of Al content.

As illustrated in FIG. 3, the energy band gap of the light absorption layer 14 that is formed of an $Al_xGa_{1-x}N$ (0<x<0.7) layer is higher than the energy band gap of the high-temperature GaN layer 12b. The first band gap change layer 13 that is adjacent to the high-temperature GaN layer 12b has a lower energy band gap, and the first band gap change layer 13 that is adjacent to the light absorption layer 14 has a higher energy band gap.

That is, the energy band gap of the first band gap change layer 13 becomes higher going from a lower layer that is adjacent to the high-temperature GaN layer 12b to an upper layer that is adjacent to the light absorption layer 14. As such, a plurality of AlGaN layers constituting the first band gap change layer 13 are configured so that Al content of the upper layer becomes higher than Al content of the lower layer.

After the light absorption layer 14 is grown, the top layer 16 that is formed of a p-In$_z$Ga$_{1-z}$N (0<z<1) layer doped with Mg is grown on the light absorption layer 14. The top layer 16 is configured to facilitate the Schottky junction of the Schottky layer 17 described later.

The thickness of the top layer 16 is generally equal to or smaller than 10 nm. If the top layer 16 is too thick, the top layer 16 may show both the PN characteristics and the Schottky characteristics at the same time. Further, Mg doping concentration of the top layer 16 may be lower than 5×10$^7$/cm3 during hall measurement.

The top layer 16 that is formed of a p-In$_z$Ga$_{1-z}$N (0<z<1) layer is generally grown at about 800° C. This is because In composition tends to differ depending on the growth temperature, even if the same In source is supplied. Further, it is also possible that the top layer 16 is grown to have a super lattice structure of p-GaN/InGaN.

After the top layer 16 is grown, the top layer 16, the light absorption layer 14, and the first band gap change layer 13 are etched through dry etching. The second electrode layer 20 is formed by depositing, for example, Cr/Ni/Au on the high-temperature GaN layer 12b that is exposed through the etching. In this case, the second electrode layer 20 and the high-temperature GaN layer 12b are configured to have ohmic characteristics. It is also possible to etch even a part of the high-temperature GaN layer 12b during the etching.

When the second electrode layer 20 is composed of Cr/Ni/Au, the electrode characteristics differ depending on the thicknesses thereof. However, the overall thickness of the second electrode layer 20 is generally equal to or larger than 400 nm.

The second electrode layer 20 includes a body portion 20a that is formed on a corner portion of the high-temperature GaN layer 12b, spaced apart from the first band gap change layer 13, and a pair of wing portions 20b extending from the body portion 20a along the edge of the first band gap change layer 13. The structure of the second electrode layer 20 prevents a peeling phenomenon of the second electrode layer 20, which is due to the stress during wire bonding.

After the second electrode 20 is formed, the Schottky layer is formed on a portion of the top layer 16, so that the top layer 16 below the Schottky layer 17 is partially exposed to along the border of the Schottky layer 17. In this case, the exposed part of the top layer 16 is covered by the Schottky fixing layer 18 described later.

Here, the Schottky layer 17 may be made of, for example, any one of ITO, ATO, Pt, W, Ti, Pd, Ru, Cr, and Au. Particularly, if the Schottky layer 17 is made of ITO having superior UV light permeability, the light permeability, the Schottky characteristics, and the reaction degree of the light detection device are improved.

Further, in consideration of the UV light permeability and the Schottky characteristics, the thickness of the Schottky layer 17 is generally equal to or smaller than 10 nm.

The Schottky fixing layer 18 is formed on the Schottky layer 17, and covers a part of the top layer 16 that is exposed along the border of the Schottky layer 17. That is, the Schottky fixing layer 18 comes in contact with both the Schottky layer 17 and the part of the top layer 16, to fix the Schottky layer 17 on the top layer 16. Thus, the peeling phenomenon of the Schottky layer 17, which is due to the stress during the wire bonding, is prevented to improve the reliability and yield of the light detection device 10. The Schottky fixing layer 18 may be made of any one of ITO, ATO, Pt, W, Ti, Pd, Ru, Cr, and Au.

The first electrode layer 19 is formed on a portion of the Schottky fixing layer 18. The first electrode layer 19 may be formed mainly using, for example, Ni/Au.

Further, the region where the first electrode layer 19 is formed on the Schottky fixing layer 18 is opaque, and thus, is unable to serve as the Schottky layer 17. Accordingly, the first electrode layer 19 is formed with the minimum area for wire bonding. The first electrode layer 19 may be formed adjacent to the corner portion of the Schottky fixing layer 18, so that the first electrode layer 19 faces the second electrode layer 20 in a diagonal direction. In other words, body portion 20a and the first electrode layer 19 may be disposed on opposing corners of the light detection device 10.

Figure 4:
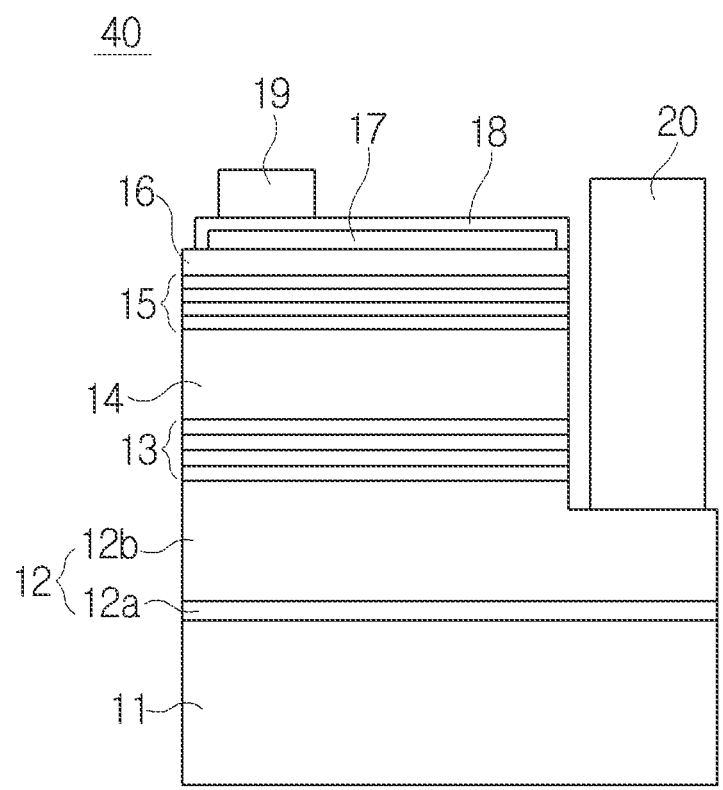
FIG. 4 is a cross-sectional view of a light detection device in accordance with an exemplary embodiment of the disclosed technology.
Figure 5:
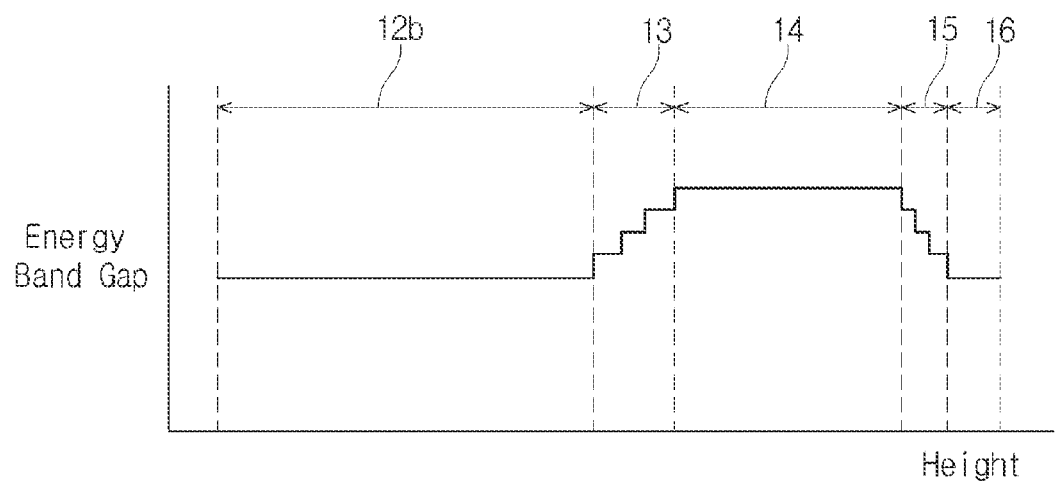
FIG. 5 is a diagram illustrating an energy band of the light detection device of FIG. 4.

FIG. 4 is a cross-sectional view of a light detection device 40 in accordance with various embodiments of the disclosed technology. FIG. 5 is a diagram illustrating an energy band of the light detection device 40.

Referring to FIGS. 4 and 5, the light detection device 40 has substantially the same configuration as the light detection device 10. Accordingly, the same reference numbers will be used for similar elements, and only the differences therebetween will be described in detail.

The light detection device 40, a second band gap change layer 15 is formed between the light absorption layer 14 and the top layer 16. The second band gap change layer 15 prevents the occurrence of a band well, due to an abrupt energy band gap change between the top layer 16 and the light absorption layer 14. This facilitates current flow and improves the crystalline characteristics of the top layer 16, by reducing crystalline defects.

The second band gap change layer 15 is grown, under the same growing conditions as the high-temperature GaN layer 12b. The second band gap change layer 15 includes a plurality of layers having different energy band gaps, in accordance with the content change of an Al source.

That is, the second band gap change layer 15 is composed of multiple layers having different Al contents. The second band gap change layer 15 may be formed through lamination of AlGaN layers having different Al contents, or may be formed through alternate lamination of AlGaN layers having different Al contents and GaN layers.

In the case of the light detection device 40, the second band gap change layer 15 is formed through lamination of the AlGaN layers having different Al contents. If the second band gap change layer 15 is too thick, it operates as a depletion layer that is formed by the Schottky effect, to exert an influence as a separate light absorption layer. Accordingly, the second band gap change layer 15 should generally have a small thickness. For example, the thickness of the second band gap change layer 15 may be equal to or smaller than 20 nm.

The layers of the second band gap change layer 15 may have the same thickness. However, the layers may have different thicknesses, and the number of the layers and the thicknesses thereof may be properly selected, as needed.

As illustrated in FIG. 5, the energy band gap of the top layer 16 that is formed of p-In$_z$Ga$_{1-z}$N (0<z<1) is lower than the energy band gap of the light absorption layer 14 that is formed of Al$_x$Ga$_{1-x}$N (0<x<0.7). The second band gap change layer 15 that is adjacent to the light absorption layer 14 has a relatively high energy band gap, and the second band gap change layer 15 that is adjacent to the top layer 16 has a relatively low energy band gap.

That is, the energy band gap of the second band gap change layer 15 becomes lower going from a lower layer that is adjacent to the light absorption layer 14 to an upper layer that is adjacent to the top layer 16. AlGaN layers constituting the second band gap change layer 15 are configured so that Al content of the upper layers is lower than the Al content of the lower layers.

Figure 6:
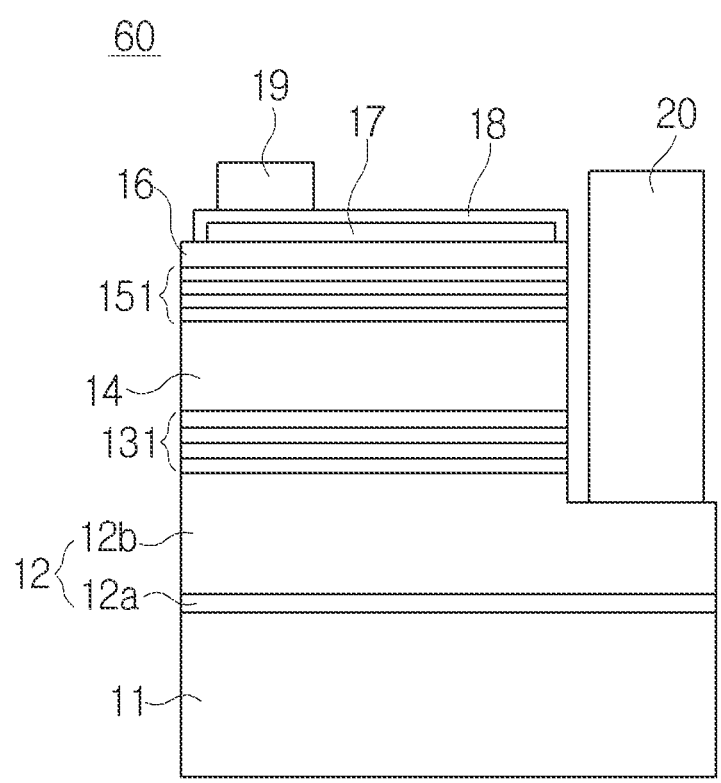
FIG. 6 is a cross-sectional view of a light detection device in accordance with an exemplary embodiment of the disclosed technology.
Figure 7:
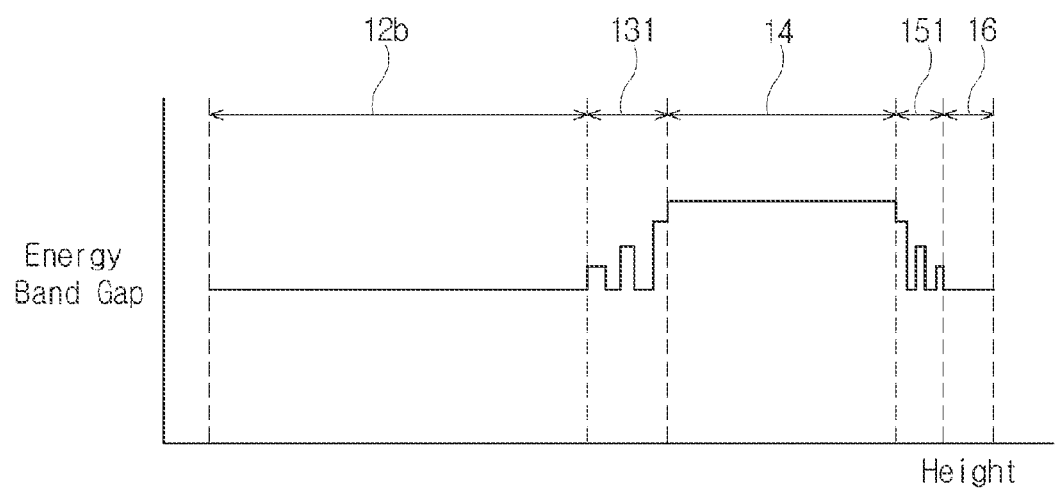
FIG. 7 is a diagram illustrating an energy band of the light detection device of FIG. 6.

FIG. 6 is a cross-sectional view of a light detection device 60 in accordance with various embodiments of the disclosed technology. FIG. 7 is a diagram illustrating an energy band of the light detection device 60.

Referring to FIG. 6, the light detection device 60 has substantially the same configuration as the light detection device 30. Accordingly, the same reference numbers will be used for similar elements, and only the differences therebetween will be described in detail.

The light detection device 60 includes a first band gap change layer 131 and a second band gap change layer 151 that are formed through alternate lamination of AlGaN layers having different Al contents and GaN layers. That is, the first band gap change layer 131 and the second band gap change layer 151 include AlGaN layers and GaN layers that are alternately laminated.

In this case, Al contents of the AlGaN layers constituting the first band gap change layer 131 become higher going from the lower layer that is adjacent to the high-temperature GaN layer 12b, to the upper layer that is adjacent to the light absorption layer 14. Further, Al contents of the AlGaN layers constituting the second band gap change layer 151 become lower going from the lower layer that is adjacent to the light absorption layer 14, to the upper layer that is adjacent to the top layer 16.

Figure 8:
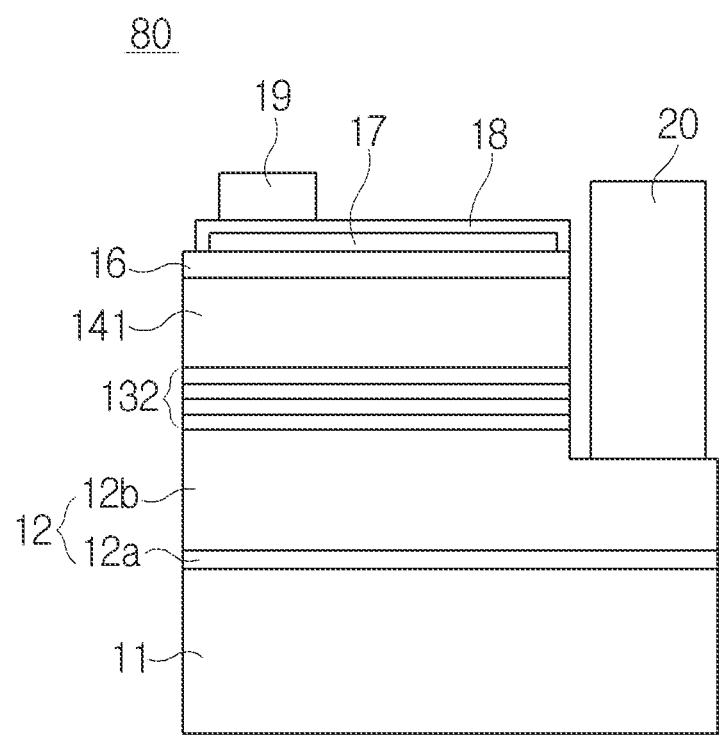
FIG. 8 is a cross-sectional view of a light detection device in accordance with an exemplary embodiment of the disclosed technology.
Figure 9:
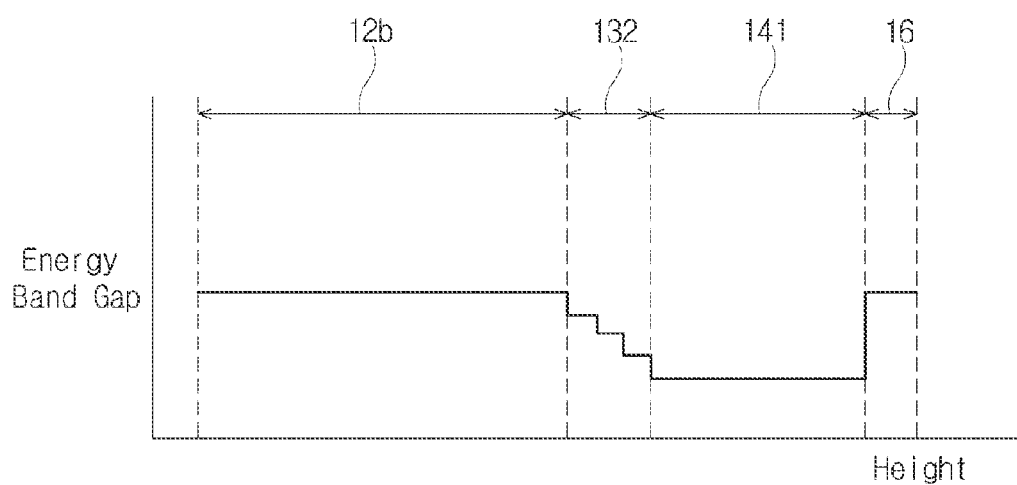
FIG. 9 is a diagram illustrating an energy band of the light detection device of FIG. 8.

FIG. 8 is a cross-sectional view of a light detection device 80, in accordance with various embodiments of the disclosed technology, and FIG. 9 is a diagram illustrating an energy band of the light detection device 80. The light detection device 80 has substantially the same configuration as the light detection device 10. Accordingly, the same reference numbers will be used for similar elements, and only the differences therebetween will be described in detail.

Referring to FIG. 8, the light detection device 80 includes a light absorption layer 141 formed of $In_yGa_{1-y}N$ (0<y<0.5). The energy band gap of the light absorption layer 141 is lower than the energy band gaps of the high-temperature GaN layer 12b and the top layer 16.

A first band gap change layer 132 is formed of an InGaN layer. The first band gap change layer 132 that is adjacent to the high-temperature GaN layer 12b has a relatively high energy band gap, and the first band gap change layer 132 that is adjacent to the light absorption layer 141 has a relatively low energy band gap. The light absorption layer 141 is formed of $In_yGa_{1-y}N$ (0<y<0.5), and the first band gap change layer 132 is formed through lamination of InGaN layers having different In contents.

The energy band gap of the light absorption layer 141 is lower than the energy band gap of the high-temperature GaN layer 12b. In the InGaN layers of the first band gap change layer 132, the In content of the lower layer that is adjacent to the high-temperature GaN layer 12b is higher than the In content of the upper layer that is adjacent to the light absorption layer 141.

Figure 10:
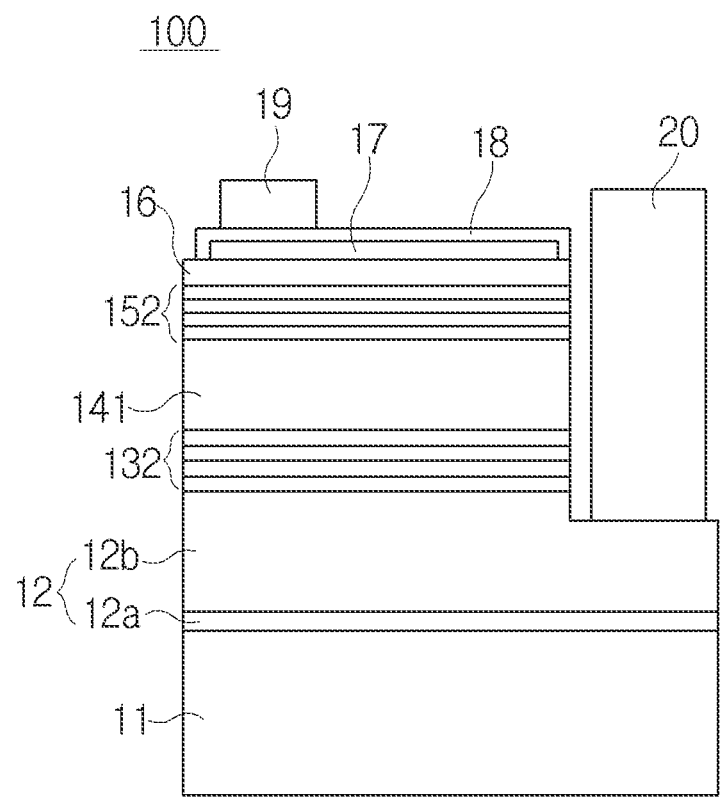
FIG. 10 is a cross-sectional view of a light detection device in accordance with an exemplary embodiment of the disclosed technology.
Figure 11:
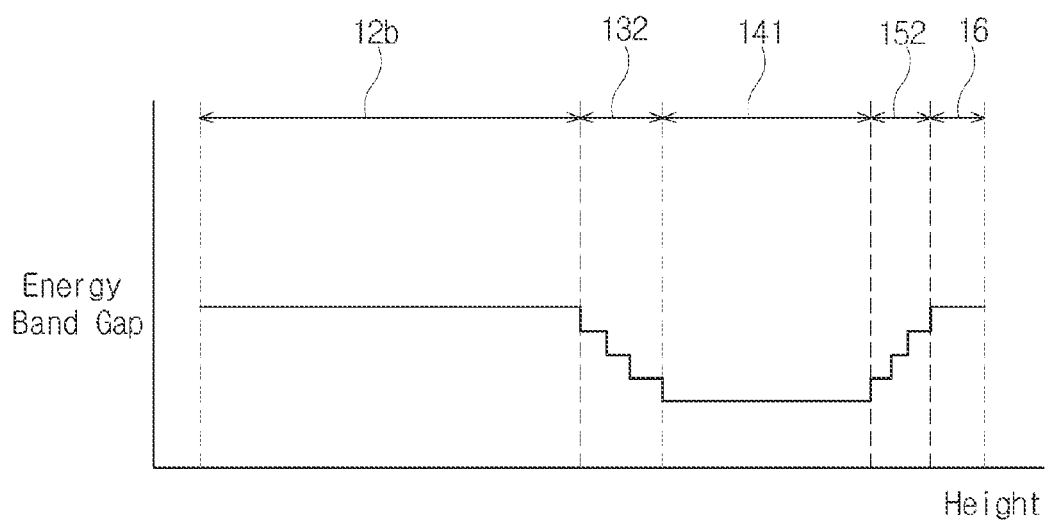
FIG. 11 is a diagram illustrating an energy band of the light detection device of FIG. 10.

FIG. 10 is a cross-sectional view of a light detection device 100 in accordance with various embodiments of the disclosed technology. FIG. 11 is a diagram illustrating an energy band of the light detection device 100. The light detection device 100 has substantially the same configuration as the light detection device 80. Accordingly, the same reference numbers will be used for similar elements, and only the differences therebetween will be described in detail.

Referring to FIG. 10, the light detection device 100 includes a second band gap change layer 152 formed between a light absorption layer 141 and the top layer 16. The second band gap change layer 152 includes InGaN layers. The second band gap change layer 152 prevents the occurrence of a band well due to an abrupt energy band gap change between the top layer 16 and the light absorption layer 141. The second band gap change layer 152 facilitates current flow, and improves the crystalline characteristics of the top layer 16, through a reduction of crystalline defects.

The second band gap change layer 152 is grown, under the same growing conditions as the high-temperature GaN layer 12b. The second band gap change layer 152 includes layers having different energy band gaps in accordance with the content change of an In source. In the light detection device 100, the second band gap change layer 152 is formed through lamination of the AlGaN layers having different In contents.

As illustrated in FIG. 11, the energy band gap of the top layer 16 that is formed of p-$In_zGa_{1-z}N$ (0<z<1) is higher than the energy band gap of the light absorption layer 141 that is formed of $In_yGa_{1-y}N$ (0<x<0.5). Accordingly, the energy band gap of the second band gap change layer 152 becomes higher from the lower layer that is adjacent to the light absorption layer 141 to the upper layer that is adjacent to the top layer 16. AlGaN layers constituting the second band gap change layer 152 are configured so that an In content of the upper layers is lower than In content of the lower layers.

Figure 12:
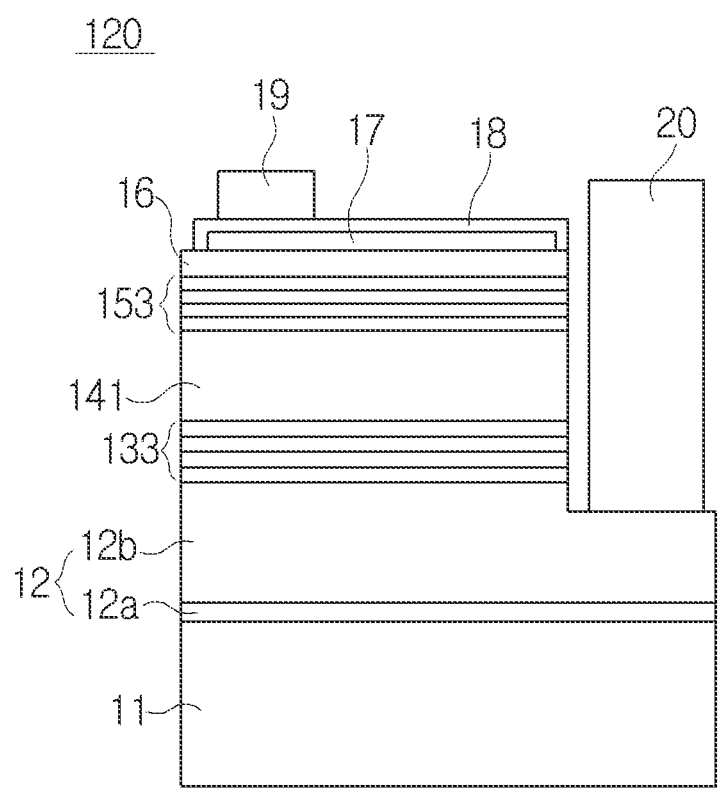
FIG. 12 is a cross-sectional view of a light detection device in accordance with an exemplary embodiment of the disclosed technology.
Figure 13:
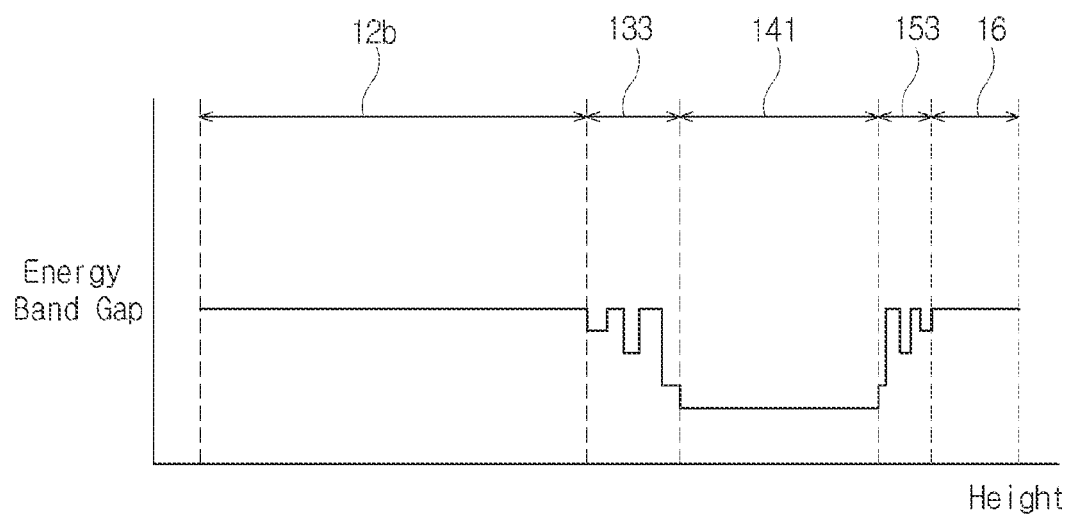
FIG. 13 is a diagram illustrating an energy band of the light detection device of FIG. 12.

FIG. 12 is a cross-sectional view of a light detection device 120 in accordance with various embodiments of the disclosed technology. FIG. 13 is a diagram illustrating an energy band of the light detection device 120. The light detection device 120 has substantially the same configuration as the light detection device 100. Accordingly, the same reference numbers will be used for similar elements, and only the differences therebetween will be described in detail.

The light detection device 120 includes a first band gap change layer 133 and a second band gap change layer 153 that are formed of InGaN/GaN layers. The first band gap change layer 133 and the second band gap change layer 153 are formed through alternate lamination of InGaN layers having different In contents and GaN layers. That is, the first band gap change layer 133 and the second band gap change layer 153 include InGaN layers and GaN layers that are alternately laminated.

In contents of the InGaN layers of the first band gap change layer 133 become higher from the lower layer that is adjacent to the high-temperature GaN layer 12b to the upper layer that is adjacent to a light absorption layer 141. In contents of the InGaN layers of the second band gap change layer 153 become lower from the lower layer that is adjacent to the light absorption layer 141 to the upper layer that is adjacent to the top layer 16.

In the following descriptions, this patent document describes some implementations providing a photo detection device capable of detecting light of different wavelength regions using one device by forming a plurality of different light absorption layers over a substrate, a photo detection package including the photo detection device, and a portable device including the photo detection package. Those implementations are associated with the features disclosed in U.S. Pat. No. 9,059,359 entitled "Photo detection device, photo detection package including the photo detection device, and portable device including the photo detection package." The U.S. Pat. No. 9,059,359 was granted from U.S. patent application Ser. No. 14/140,086, filed on Dec. 24, 2013, which claims priorities to Korean Patent Application Nos.

10-2012-0155413, filed on Dec. 27, 2012, and 10-2013-0006274, filed on Jan. 21, 2013. The entire disclosure in U.S. Pat. No. 9,059,359 is incorporated by reference as part of this disclosure.

Light is classified into several bands by wavelengths. For example, ultraviolet rays (UV) having a wavelength of 400 nm or less may be classified into UV-A, UV-B, and UV-C light. The UV-A region light has a wavelength range of 320 nm to 400 nm, and 98% or more of UV-A region light of solar light may reach the surface of the earth. The UV-A region light may have an influence of darkening or ageing phenomenon on human skin. The UV-B region light has a wavelength range of 280 nm to 320 nm, and only 2% of the UV-B region of solar light may reach the surface of the earth. The UV-B region light may have a very serious influence of skin cancer, cataracts, and a red spot phenomenon on the human body.

Most of the UV-B region light may be absorbed by the ozone layer, but the amount of UV-B region light that reaches the surface of the earth may be increased, and an area reached by UV-B region light may also be increased owing to the recent destruction of the ozone layer, which raises a serious environmental problem. The UV-C region light has a wavelength range of 200 nm to 280 nm, and almost the entire UV-C region of solar light may be absorbed by the atmosphere and thus the UV-C region may rarely reach the surface of the earth. The UV-C may be chiefly used in a sterilization action. A representative value of quantified influences of UV light on the human body is a UV index defined by the incident amount of UV-B region light.

Devices capable of detecting UV light include a Photo-Multiplier Tube (PMT) and a semiconductor device. The semiconductor device may be commonly used because the semiconductor device may be cheaper than the PMT and the semiconductor device may also have a smaller size than the PMT. The semiconductor device may be made of gallium nitride (GaN) or silicon carbide (SiC) having a proper energy bandgap capable of detecting UV light. In the case of a device based on GaN, a Schottky junction type device, a Metal-Semiconductor-Metal (MSM) type device, and a PIN type device may be used. In particular, the Schottky junction type device may be preferred because of its simple fabrication process.

The Schottky junction type device has a structure in which a buffer layer, a light absorption layer, and a Schottky junction layer are sequentially stacked over a heterogeneous substrate, a first electrode is formed on the buffer layer or the light absorption layer, and a second electrode is formed on the Schottky junction layer. However, a conventional Schottky junction type device may require two or more devices for detecting different wavelength regions because it has a device characteristic that detects only a single wavelength.

Korean Patent Laid-Open Publication No. 10-2007-0106214 discloses a semiconductor light-receiving device in which a first light absorption layer, a second light absorption layer, and an electrode layer are sequentially formed over a substrate in order to detect different wavelength regions in response to an increase in the bias of the electrode layer in a single device. In the case of the Korean Patent, however, a wavelength region of the first light absorption layer in 0-bias, and a wavelength region of the second light absorption layer may be detected when a reverse bias is applied. As the reverse bias rises, a reactivity value of the first light absorption layer may also increase.

That is, it may be difficult to detect an accurate reactivity value because the reactivity value may vary depending on a reverse bias value even in the first light absorption layer for detecting the same area. Furthermore, the reactivity value may be changed in each wavelength band when another wavelength region of the first light absorption layer is detected according to a further increase of a reverse bias. Accordingly, there may be problems in that a reactivity value may be frequently changed by a reverse bias value and reliability of a product may be deteriorated because a reactivity value is represented as a change of a fine current.

In general, a Light-Emitting Diode (LED) is applied to recent light-emitting means. An LED may be used in many electronic products, such as digital wall clocks, wrist watches, TV, traffic lights, and display screens, and may also be used in efficient energy lighting systems, lamps, and flashlights because it consumes less thermal energy than an existing bulb. There is also disclosed an UV LED having a sterilization function by discharging UV light. A photo detection device may have a function of detecting an amount of light. Such a photo detection device may have a function of measuring a UV index by detecting the amount of UV light. Products to which the LED or the photo detection device has been applied, however, may not be equipped with means for checking whether or not the LED or the photo detection device operates normally. Accordingly, there may be a problem in that reliability of a product may not be guaranteed because whether or not a UV LED emits the proper amount of UV light and whether or not a photo detection device for detecting UV light has accurately measured the amount of UV light.

Photo detection devices and photo detection packages including the photo detection devices in accordance with some embodiments of the disclosed technology are described with reference to FIG. 14 to FIG. 28. The following embodiments illustrate the detection of UV light, but the disclosed technology may also be used to detect light having different wavelength regions in addition to the UV wavelength.

Figure 14:
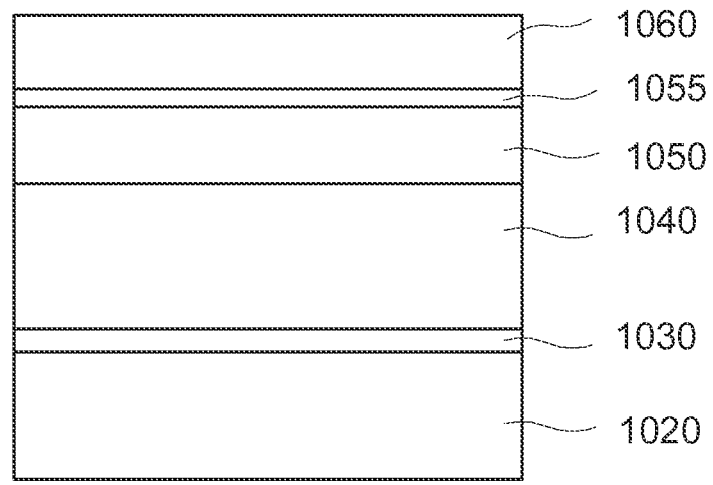
FIG. 14 is a schematic diagram of the stack structure of a photo detection device in accordance with an exemplary embodiment of the disclosed technology.

FIG. 14 is a schematic diagram of the stack structure of a photo detection device in accordance with an exemplary embodiment of the disclosed technology.

As shown in FIG. 14, in order to fabricate the photo detection device 1010 in accordance with the exemplary embodiment of the disclosed technology, a buffer layer 1030, a first light absorption layer 1040, a second light absorption layer 1050, a first strain reduction layer 55, and a third light absorption layer 1060 are sequentially stacked over a substrate 1020.

The substrate 1020 may be made of sapphire, AlN, GaN, SiC, or Si, and the structure of the photo detection device 1010 may be changed depending on a conductive substrate.

First, the substrate 1020 is placed in the susceptor of a Metal Organic Chemical Vapor Deposition (MOCVD) reaction chamber. Impurity gas within the reaction chamber is removed by lowering pressure within the reaction chamber to 100 torr or less.

Thereafter, a surface of the heterogeneous substrate 1020 is thermally washed by maintaining pressure within the reaction chamber to 100 torr and raising temperature to 1100° C. A low-temperature GaN layer, that is, the buffer layer 1030, is grown by lowering the temperature up to 550° C. and flowing a Ga source and ammonia ($NH_3$) gas. Here, the overall flow of the gas within the reaction chamber is determined by hydrogen ($H_2$) gas.

In order to secure the crystallizability and optical and electrical characteristics of the first light absorption layer 1040, that is, a high-temperature GaN layer that is grown on the buffer layer 30, that is, a low-temperature GaN layer, the buffer layer 1030 may be formed to a thickness of about at least 25 nm. If the buffer layer 1030 is grown as a low-temperature AlN layer, the buffer layer 1030 may be grown to a thickness of about 25 nm at about 600° C.

After growing the buffer layer 1030, the first light absorption layer 1040, that is, a high-temperature GaN layer, is grown by raising temperature within the susceptor up to from 1000° C. to 1100° C., for example, up to 1050° C. Optical, electrical, and crystalline characteristics may be deteriorated if the temperature is less than 1000° C. and surface roughness is increased and crystallizability may be deteriorated if the temperature exceeds 1100° C.

The thickness of the first light absorption layer 1040, that is, a high-temperature GaN layer, may be about 2 µm. The first light absorption layer 1040 may have an n-type characteristic although it is not doped, but may be doped with Si in order to obtain an n-type effect.

Thereafter, the second light absorption layer 1050 is grown on the first light absorption layer 1040. First, an $Al_xGa_{1-x}N$ layer (0<x<1) is grown by supplying an Al source under a growth condition similar to that of the first light absorption layer 1040.

In growing the second light absorption layer 1050, in order to use the second light absorption layer 1050 as a light absorption layer for detecting a UV-B region, the second light absorption layer 1050 may have an Al composition of 15% or higher. In order to increase light absorption efficiency, the second light absorption layer 1050 may have a thickness of 0.1 µm~2 µm.

The third light absorption layer 1060 is grown on the second light absorption layer 1050. First, an $Al_yGa_{1-y}N$ layer (0<y<1) is grown by supplying an Al source under a growth condition similar to that of the first light absorption layer 1040.

In growing the third light absorption layer 1060, in order to use the third light absorption layer 1060 as a light absorption layer for detecting an UV-C region, the third light absorption layer 1060 may have an Al composition of about 40% or higher. In order to increase light absorption efficiency, the third light absorption layer 1060 may have a thickness of 0.1 µm to 2 µm.

In order to reduce strain that may be generated at the interface between the second light absorption layer 1050 and the third light absorption layer 1060, the first strain reduction layer 1055 may be formed of an $Al_dIn_{1-d}N$ (0<d≤1) layer between the second light absorption layer 1050 and the third light absorption layer 1060.

If the first strain reduction layer 1055 is formed of a high-temperature AlN layer at a temperature of about 1050° C., the first strain reduction layer 1055 may have a thin thickness of 50 nm or less because the first strain reduction layer 55 becomes close to an insulating layer due to an energy bandgap of about 6 eV, it may be difficult to obtain high-quality crystallizability, and the first strain reduction layer 1055 may hinder the flow of a fine current according to crystallizability and insulating characteristics.

If the first strain reduction layer 1055 is formed of $Al_dIn_{1-d}N$ (0<d<1), the first strain reduction layer 1055 may be grown at a temperature of 900° C. or less in order to form a layer containing In. Here, the first strain reduction layer 1055 may have a superlattice form in which a plurality of layers is repeated.

As described above, according to the present exemplary embodiment, light having different wavelength bands can be detected by forming the first light absorption layer 40, the second light absorption layer 1050, and the third light absorption layer 1060 having different energy bandgaps. In another exemplary embodiment, each of the first light absorption layer 1040, the second light absorption layer 1050, and the third light absorption layer 1060 may be formed of any one of the $Al_xGa_{1-x}N$ (0<x<y) layer, the $Al_yGa_{1-y}N$ (x<y<1) layer, and the $In_zGa_{1-z}N$ (0<z<1) layer so that the $Al_xGa_{1-x}N$ (0<x<y) layer, the $Al_yGa_{1-y}N$ (x<y<1) layer, or the $In_zGa_{1-z}N$ (0<z<1) layer used in one of the first to third absorption layers is not used in the remaining layers.

That is, the three different light absorption layers may be formed of the $Al_xGa_{1-x}N$ (0<x<y) layer, the $Al_yIn_{1-y}N$ (x<y<1) layer, and the $In_zGa_{1-z}N$ (0<z<1) layer, respectively. The order of the three different light absorption layers may be selected in various ways.

Figure 15:
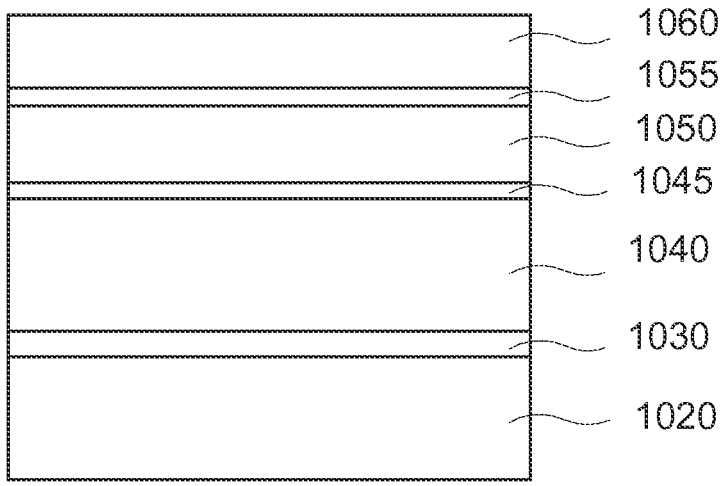
FIG. 15 is a schematic diagram of the stack structure of a photo detection device in accordance with an exemplary embodiment of the disclosed technology.

FIG. 15 is a schematic diagram of the stack structure of a photo detection device in accordance with an exemplary embodiment of the disclosed technology.

The stack structure of the photo detection device of FIG. 15 is similar to that of FIG. 14 except that a second strain reduction layer 1045 is formed between the first light absorption layer 1040 and the second light absorption layer 1050.

Accordingly, the same elements as those of the first exemplary embodiment described with reference to FIG. 14 are assigned the same reference numerals, and a redundant description is omitted.

In accordance with the present embodiment of the p, the second strain reduction layer 1045 formed of an $Al_fIn_{1-f}N$ (0<f≤1) layer is formed between the first light absorption layer 1040 and the second light absorption layer 1050. The second strain reduction layer 1045 is formed in order to prevent the deterioration of characteristics and a reduction of yield attributable to a crack that may be generated due to lattice mismatching and a difference in the coefficient of thermal expansion between the first light absorption layer 1040 formed of the high-temperature GaN layer and the second light absorption layer 1050 formed of the $Al_xGa_{1-x}N$ layer (0<x<1).

In order to solve the occurrence of such a crack, the second strain reduction layer 1045 formed of the $Al_fIn_{1-f}N$ (0<f≤1) layer is formed between the first light absorption layer 1040 and the second light absorption layer 1050.

If the second strain reduction layer 1045 is formed of a high-temperature AlN layer at a temperature of about 1050° C., the second strain reduction layer 1045 may have a thin thickness of 50 nm or less because the second strain reduction layer 1045 becomes close to an insulating layer due to an energy bandgap of about 6 eV, it may be difficult to obtain high-quality crystallizability, and the second strain reduction layer 1045 may hinder the flow of a fine current according to crystallizability and insulating characteristics.

If the second strain reduction layer 1045 is formed of $Al_fIn_{1-f}N$ (0<f<1), the second strain reduction layer 1045 may be grown at a temperature of 900° C. or less in order to form a layer containing In. Here, the second strain reduction layer 1045 may have a superlattice form in which a plurality of layers is repeated.

Figure 16:
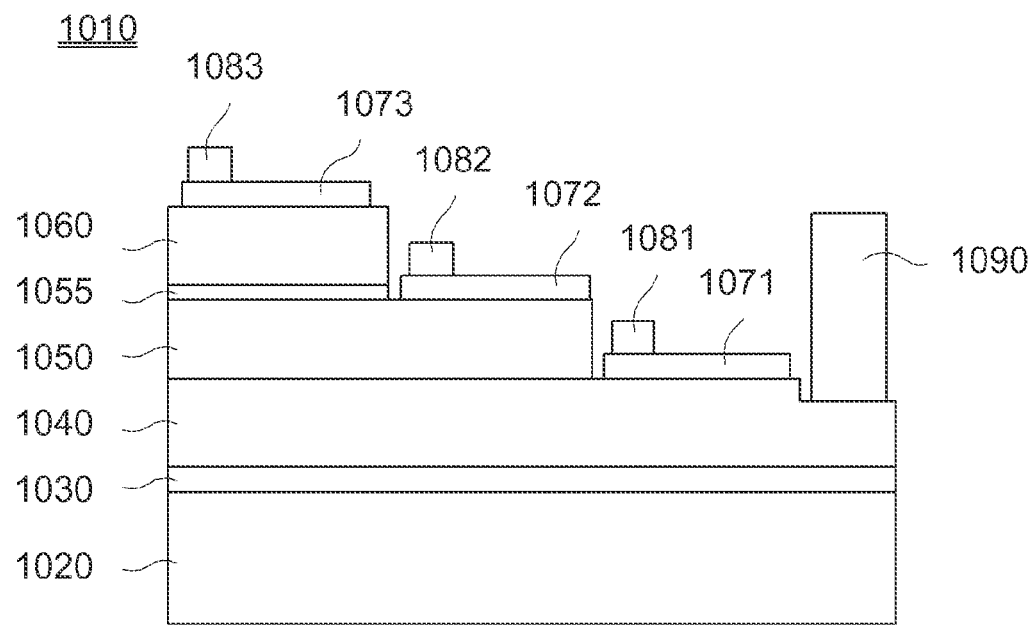
FIG. 16 is a cross-sectional view of the photo detection device of FIG. 14.
Figure 17:
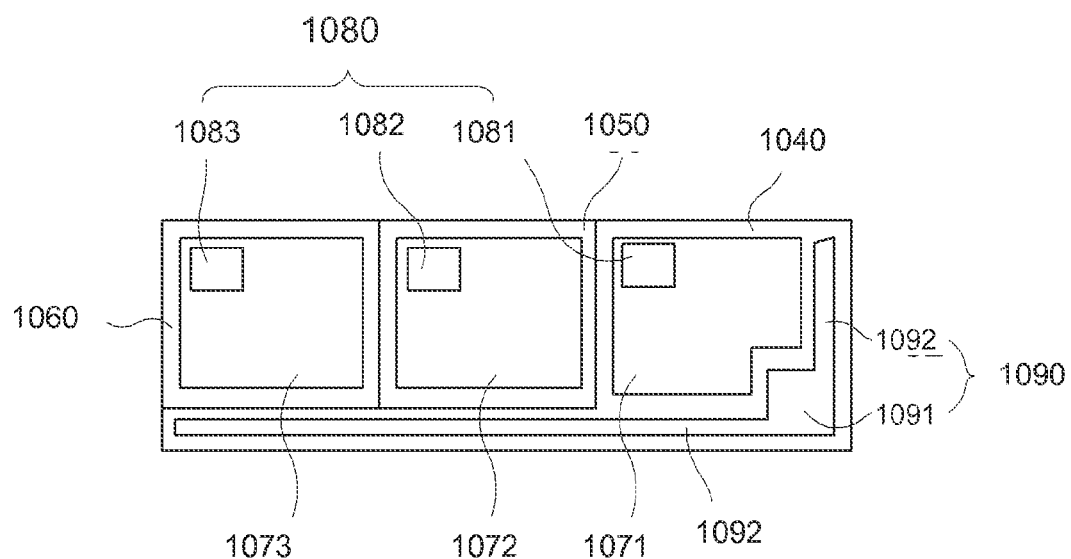
FIG. 17 is a plan view of the photo detection device of FIG. 15.

FIG. 16 is a cross-sectional view of the photo detection device of FIG. 14, and FIG. 17 is a plan view of the photo detection device of FIG. 14.

In accordance with the exemplary embodiment as shown in FIG. 14, the photo detection device is configured so that a plurality of different wavelength bands can be detected in one device.

For example, in the prior art, three photo detection devices are used to detect three different types of wavelength bands in order to accurately detect reactivity. In contrast, in accordance with the first exemplary embodiment of the disclosed technology, three different types of wavelength bands can be detected in one photo detection device.

In the present exemplary embodiment, the photo detection device capable of detecting three different wavelength bands is illustrated. However, a variety of different wavelength bands, such as 2, 4, or 5, can be detected depending on the number of stacked light absorption layers.

Although the stack structure of FIG. 14 has been applied to the present embodiment, the stack structure of FIG. 15 can be applied instead of that of FIG. 14.

Furthermore, the first light absorption layer 1040, the second light absorption layer 50, and the third light absorption layer 1060 are formed to have different energy bandgaps. For example, the first light absorption layer 1040 may be formed of a high-temperature GaN layer, the second light absorption layer 1050 may be formed of an $Al_xGa_{1-x}N$ ($0<x<1$) layer, and the third light absorption layer 1060 may be formed of an $Al_yGa_{1-y}N$ ($0<y<1$) layer.

In another exemplary embodiment, each of the first light absorption layer 1040, the second light absorption layer 1050, and the third light absorption layer 1060 may be formed of any one of the $Al_xGa_{1-x}N$ ($0<x<y$) layer, the $Al_yGa_{1-y}N$ ($x<y<1$) layer, and the $In_zGa_{1-z}N$ ($0<z<1$) layer in such a manner that the $Al_xGa_{1-x}N$ ($0<x<y$) layer, the $Al_yGa_{1-y}N$ ($x<y<1$) layer, or the $In_zGa_{1-z}N$ ($0<z<1$) layer used in any one of the first to the third absorption layers is not used in the remaining absorption layers.

The three different light absorption layers may be formed of the $Al_xGa_{1-x}N$ ($0<x<y$) layer, the $Al_yGa_{1-y}N$ ($x<y<1$) layer, and the $In_zGa_{1-z}N$ ($0<z<1$) layer, respectively. The order of the three different light absorption layers may be selected in various ways.

First, the third light absorption layer 1060, the first strain reduction layer 1055, and the second light absorption layer 1050 are etched by dry etching so that the second light absorption layer 1050 is formed in some region on the first light absorption layer 1040. A first Schottky layer 1071 is formed in some region on a surface of the first light absorption layer 1040 which has been exposed by the etching.

Thereafter, the third light absorption layer 1060 and the first strain reduction layer 1055 are etched by dry etching so that the third light absorption layer 1060 is formed in some region on the second light absorption layer 1050. A second Schottky layer 1072 is formed in some region on a surface of the second light absorption layer 1050 which has been exposed by the etching.

A third Schottky layer 1073 is formed in some region on a surface of the third light absorption layer 1060 which has not been etched, and a first electrode layer 1080 is formed in some region on each of the first, the second, and the third Schottky layers 1071, 1072, and 1073.

The first electrode layer 1080 includes a (1-1) electrode layer 1081 formed in some region on the first Schottky layer 1071, a (1-2) electrode layer 1082 formed in some region on the second Schottky layer 1072, and a (1-3) electrode layer 1083 formed in some region on the third Schottky layer 1073.

Each of the first, the second, and the third Schottky layers 1071, 1072, and 1073 may be made of any one of indium tin oxide (ITO), Pt, W, Ti, Pd, Ru, Cr, Au, Ni, and Cr and may be formed to a thickness of 10 nm or less by taking light transmittance and a Schottky characteristic into consideration.

A second electrode layer 1090 is configured to have an ohmic characteristic and may be formed on the first light absorption layer 1040 so that it is spaced apart from the first Schottky layer 1071. For example, after etching part of the first light absorption layer 1040, the second electrode layer 1090 may be formed in the etched part.

The second electrode layer 1090 may be formed on one side of the first Schottky layer 1071 in a bar from. The second electrode layer 1090 may be formed to have a wing shape so that the flow of an electric current generated from the second light absorption layer 1050 and the third light absorption layer 1060 is facilitated. The second electrode layer 1090 includes a body unit 1091 spaced apart from the first Schottky layer 1071 and formed in the corner part of the first light absorption layer 1040 and a pair of wing units 1092 extended from the body unit 1091 along the edges of the first light absorption layer 1040.

If the second electrode layer 1090 is formed of the body unit 1091 and the pair of wing units 1092 as described above, a peeling phenomenon of the second electrode layer 1090 attributable to strain when wire bonding is performed can be prevented.

The first electrode layer 1080 may be made of Ni/Au and formed to a thickness ranged from 200 nm to 2 μm. Furthermore, the second electrode layer 1090 may be made of Cr/Ni/Au and formed to a thickness ranged from 400 nm to 2 μm. Here, the top of the second electrode layer 1090 is formed to have a height almost corresponding to the top of the third light absorption layer 1060.

In the photo detection device formed as described above, the light absorption layers may detect light having different wavelength bands, and the light absorption layers are configured in such a way as to operate individually.

Figure 18:
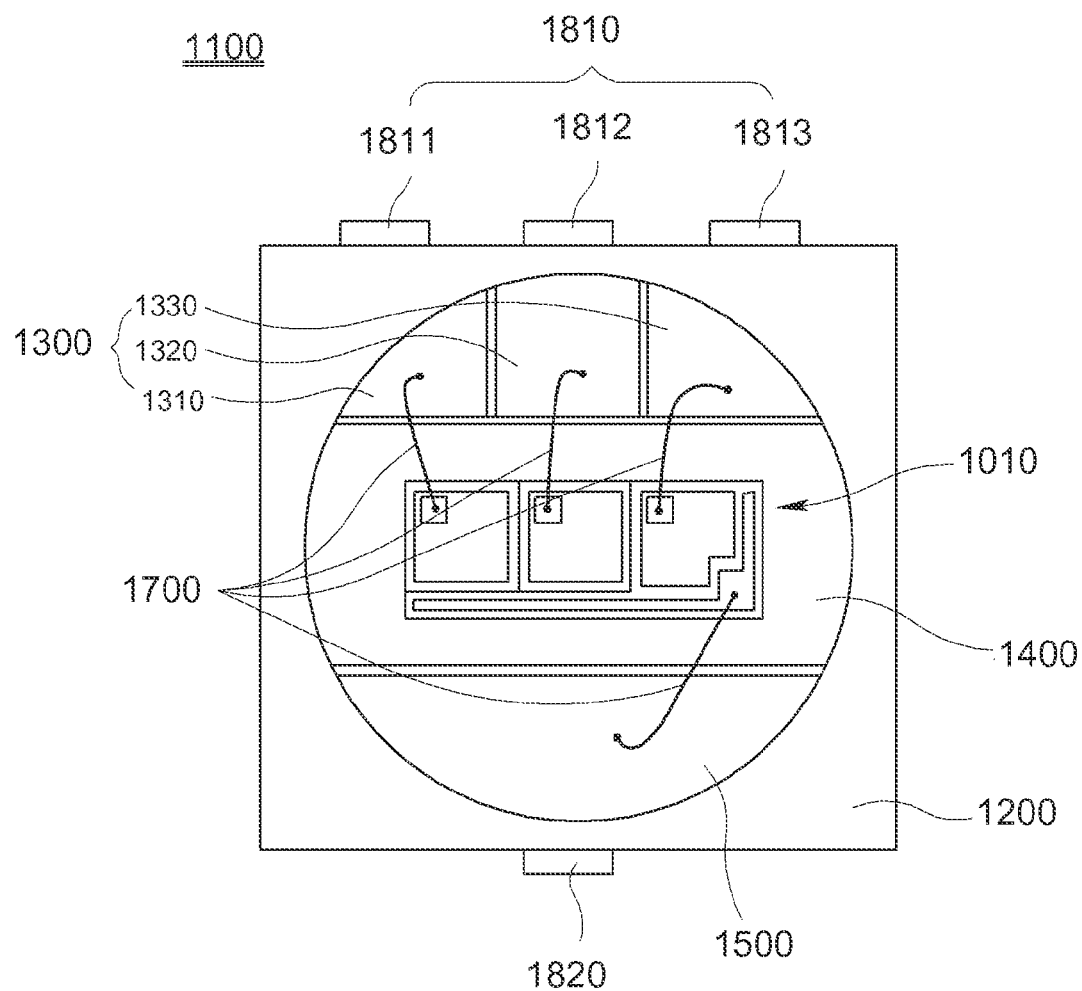
FIG. 18 is a plan view of a photo detection package in accordance with an exemplary embodiment of the disclosed technology.
Figure 19:
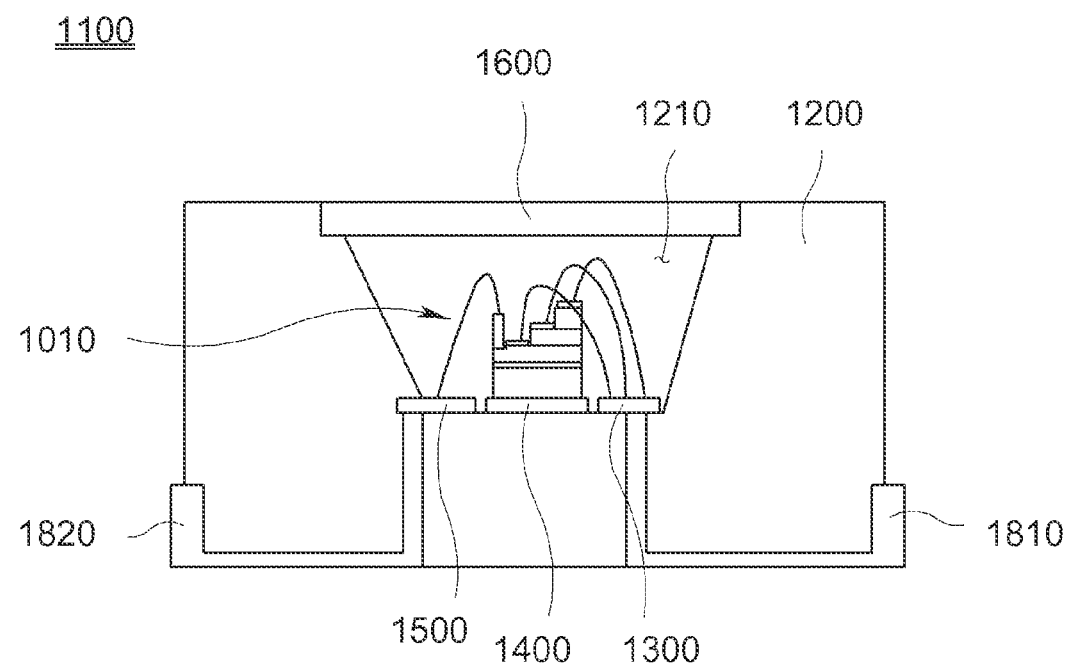
FIG. 19 is a cross-sectional view of the photo detection package of FIG. 18.

An example in which a photo detection package is configured using the photo detection device 1010 described with reference to FIGS. 18 and 19 is described below.

FIGS. 18 and 19 are a plan view and a cross-section view of a photo detection package in accordance with the exemplary embodiment shown in FIG. 14.

As shown in FIGS. 18 and 19, the photo detection package 1100 in accordance with the an exemplary embodiment may include a lead frame 1200 configured to have a depression unit 1210 formed on its upper side, a photo detection device mounted on the depression unit 1210, and a plurality of first electrode plates 1300 formed on one side of the bottom surface of the depression unit 1210 and spaced apart from one another.

The depression unit 1210 of the lead frame 200 is closed by a window 1600 in order to protect the photo detection device within the depression unit 1210. The window 1600 is made of transparent materials, such as quartz, sapphire, or crystal, and is seated along the upper edge of the depression unit 1210.

The inner circumference surface of the depression unit 1210 may be inclined by taking the reflection of light into consideration. In some embodiments, the inner circumference surface of the depression unit 1210 may be formed at right angle.

Furthermore, the photo detection device mounted on the depression unit 1210 of the lead frame 1200 may be, for example, the photo detection device 1010 described with reference to FIGS. 16 and 17. The photo detection device 1010 has a structure in which a plurality of light absorption layers having different energy bandgaps are sequentially stepped and formed. The first electrode layers 1080 are formed on the respective light absorption layers.

A Schottky layer is formed in some region on each of the light absorption layers, and the first electrode layer 1080 is formed in some region on each of the Schottky layers.

For example, the first Schottky layer 1071 is formed in some region on the first light absorption layer 1040, and the (1-1) electrode layer 1081 is formed in some region on the first Schottky layer 1071. Furthermore, the second Schottky layer 1072 is formed in some region on the second light absorption layer 1050, and the (1-2) electrode layer 1082 is formed in some region on the second Schottky layer 1072.

Furthermore, the third Schottky layer 1073 is formed in some region on the third light absorption layer 1060, and the (1-3) electrode layer 1083 is formed in some region on the third Schottky layer 1073.

The first electrode plate 1300 includes a (1-1) electrode plate 310, a (1-2) electrode plate 1320, and a (1-3) electrode plate 1330 that are spaced apart from one another. The (1-1) electrode plate 1310 is electrically connected to the (1-1) electrode layer 1081 by a bonding wire 1700 made of Au, for example. The (1-2) electrode plate 1320 is electrically connected to the (1-2) electrode layer 1082 by a bonding wire 1700. The (1-3) electrode plate 1330 is electrically connected to the (1-3) electrode layer 1083 by a bonding wire 1700.

The second electrode layer 1090 having a wing form is formed on the first light absorption layer 1040 and is spaced apart from the first Schottky layer 1071. The second electrode layer 1090 is electrically connected to a second electrode plate 1500 formed on the other side of the bottom surface of the depression unit 1210 by a bonding wire 1700.

A device contact plate 1400 is formed between the first electrode plate 1300 and the second electrode plate 1500 and is spaced apart from the first electrode plate 1300 and the second electrode plate 1500. The photo detection device 1010 is mounted on the device contact plate 400.

That is, the first electrode plate 1300, the second electrode plate 1500, and the device contact plate 1400 are disposed in such a way as to be spaced apart from one another. The photo detection device 1010 is mounted on the device contact plate 1400. The (1-1), the (1-2), and the (1-3) electrode layers 1081, 1082, and 1083 of the photo detection device 1010 are electrically connected to the respective (1-1), (1-2), and (1-3) electrode plates 1310, 1320, and 1330 by the respective bonding wires 1700. The second electrode layer 1090 of the photo detection device 1010 is electrically connected to the second electrode plate 1500 by the bonding wire 1700.

A plurality of first lead wires 1810 electrically connected to the plurality of first electrode plates 1300, respectively, protrudes from and is formed on one side of the lead frame 1200 so that the plurality of first lead wires 1810 is connected to external electrode lines (not shown) and individually driven. A second lead wire 1820 electrically connected to the second electrode plate 1500 protrudes from and is formed on the other side of the lead frame 1200.

The first lead wires 1810 include a (1-1) lead wire 1811 electrically connected to the (1-1) electrode plate 1310, a (1-2) lead wire 1812 electrically connected to the (1-2) electrode plate 1320, and a (1-3) lead wire 1813 electrically connected to the (1-3) electrode plate 1330. The (1-1), the (1-2), and the (1-3) lead wires 1811, 1812, and 1813 are spaced apart from one another.

Accordingly, the light absorption layers can be individually driven by selectively supplying power sources to the light absorption layers through the first lead wires 1810.

Figure 20A:
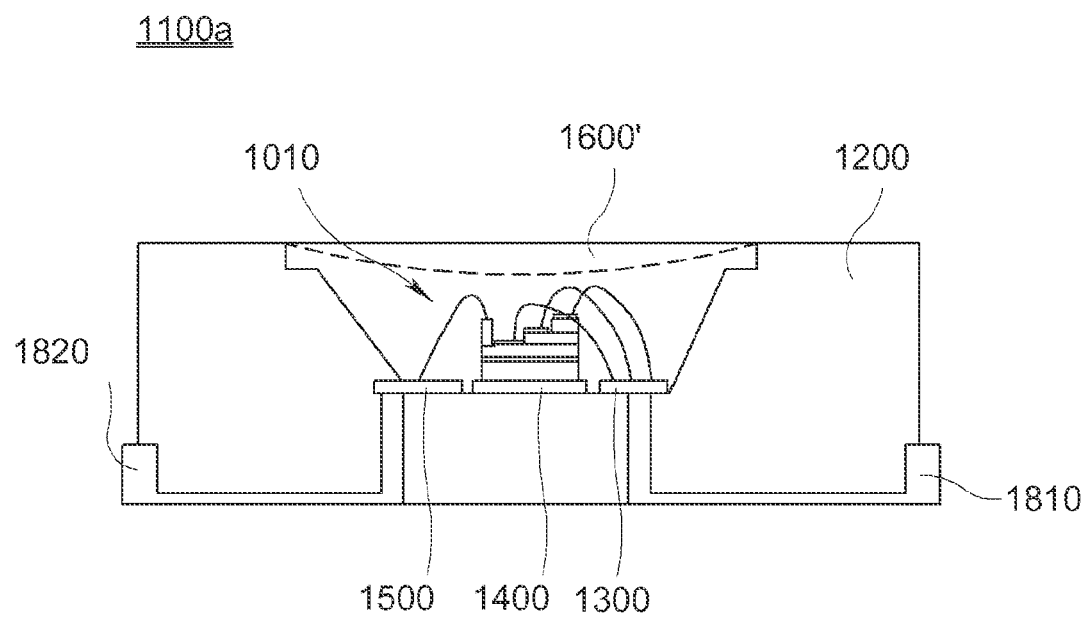
FIGS. 20A and 20B are cross-sectional views of a photo detection package in accordance with an exemplary embodiment of the disclosed technology.
Figure 20B:
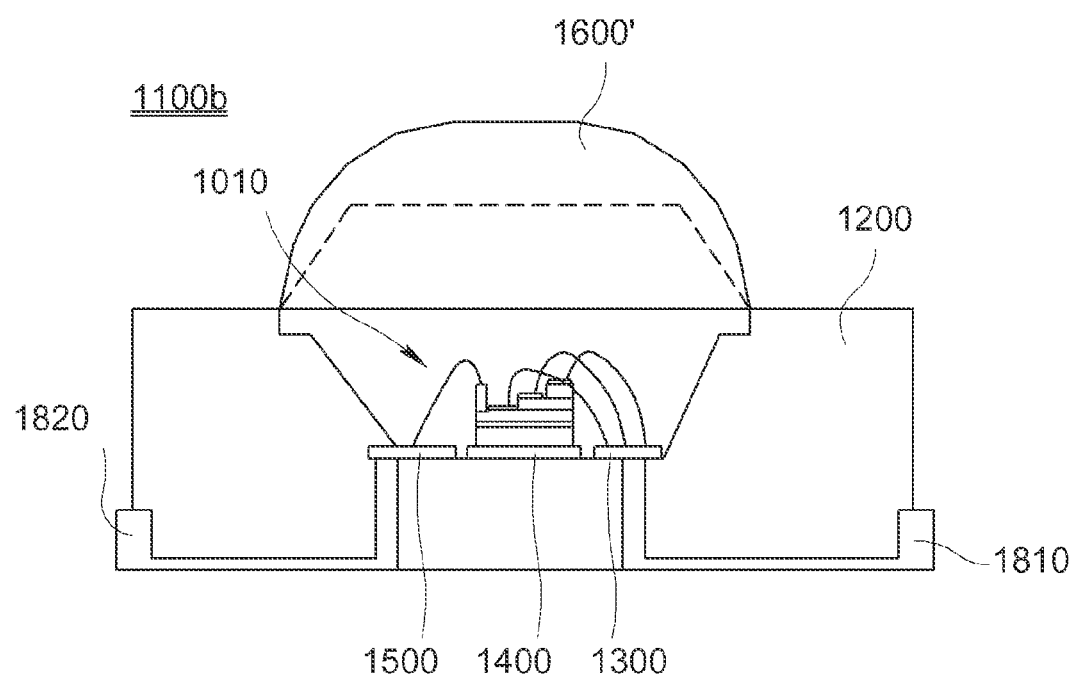

FIGS. 20A and 20B are cross-sectional views of a photo detection package in accordance with an exemplary embodiment of the disclosed technology. The present exemplary embodiment shows an example in which the photo detection device 1010 is protected by filling the depression unit 1210 with epoxy resin instead of using the window of the exemplary embodiment described with reference to FIGS. 18 and 19.

Accordingly, the same elements as those of the aforementioned embodiment are assigned the same reference numerals, and a redundant description is omitted.

As shown in FIG. 20A, if a protection layer 1600' is formed by filling the depression unit 1210 of the photo detection package 1100a with epoxy resin to be substantially flat, light may be absorbed by the Schottky layer at an angle of about 120°. If the protection layer 1600' is concaved and formed as indicated by a dotted line, light absorbed at an angle of 120° or more can be detected.

Furthermore, as shown in FIG. 20B, if the protection layer 1600' having a dome shape is formed in the depression unit 1210 of the photo detection package 1100b, light absorbed at an angle of 120° or less can be detected. The protection layer 1600' may be formed in a trapezoid shape as indicated by a dotted line. That is, a wavelength at a desired angle can be detected depending on a shape of the window 1600 or the protection layer 1600'.

Figure 21:
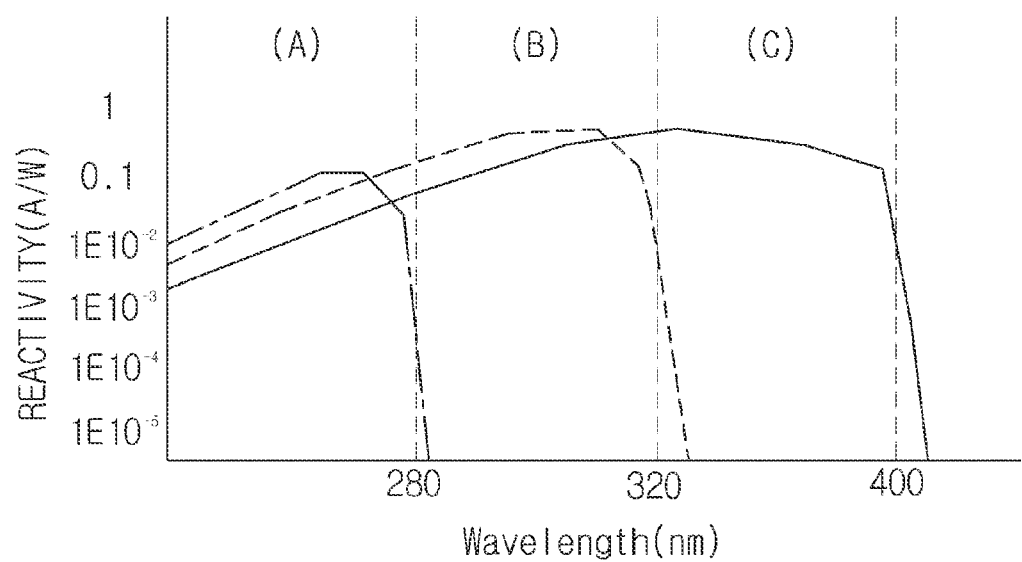
FIG. 21 is a graph showing photo reactivity measured in accordance with an exemplary embodiment of the disclosed technology.

FIG. 21 is a graph showing that photo reactivity measured in accordance with an exemplary embodiment of the disclosed technology. The graph shows photo reactivities measured using the photo detection device 1010 in which the electrodes of different light absorption layers are separately connected and individually driven in a structure in which the different light absorption layers are included in the single device and the Schottky layers are formed on the respective light absorption layers.

In FIG. 21, reactivity of (A) shows reactivity in the third light absorption layer 1060, reactivity of (B) shows reactivity in the second light absorption layer 1050, and reactivity of (C) shows reactivity in the first light absorption layer 1040.

That is, in the photo detection device 1010 according to an exemplary embodiment of the disclosed technology, wavelength bands to be detected in the respective light absorption layers do not need to be made sequential, and energy bandgaps that determine the absorption wavelengths of the respective light absorption layers do not need to be sequentially increased or decreased.

Figure 22:
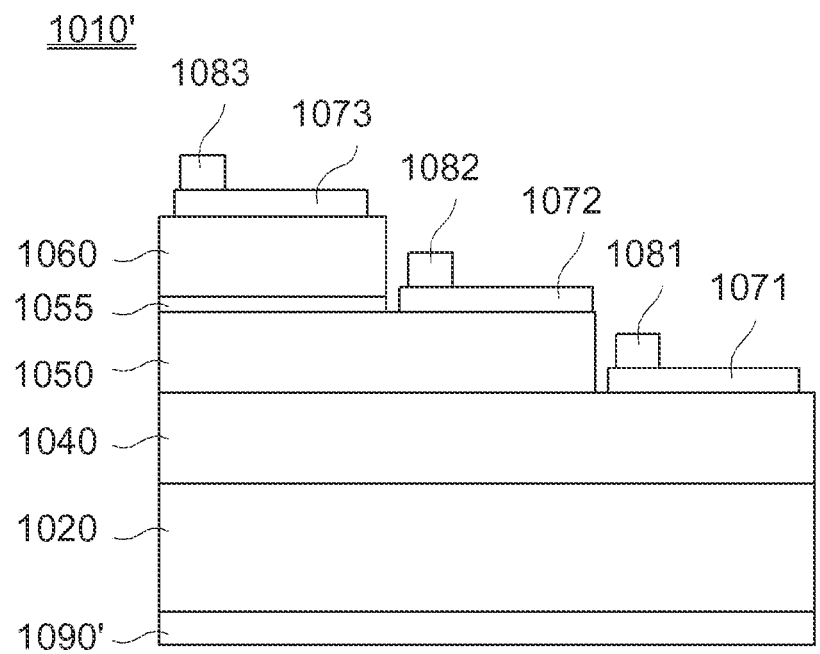
FIG. 22 is a cross-sectional view of a photo detection device in accordance with a third exemplary embodiment of the disclosed technology.
Figure 23:
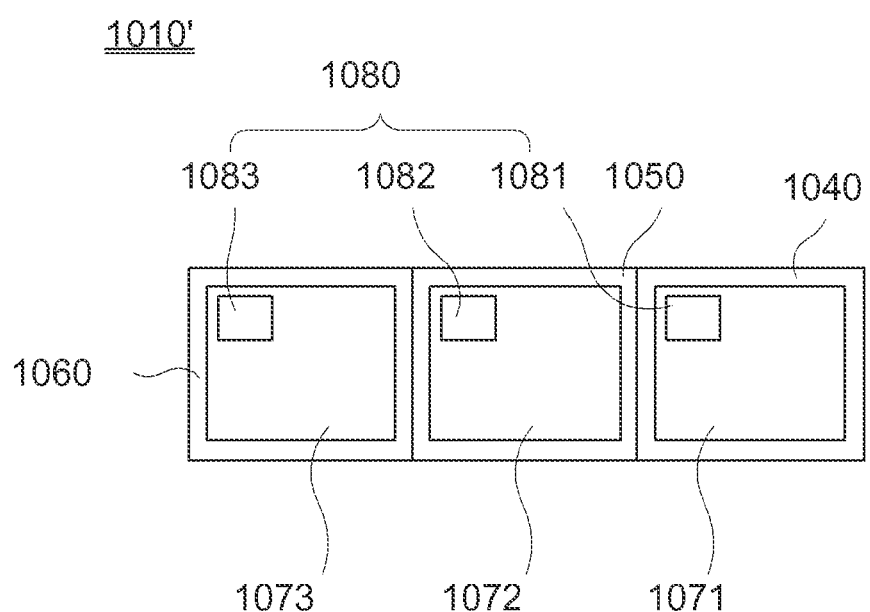
FIG. 23 is a plan view of the photo detection device in accordance with an exemplary embodiment of the disclosed technology.

FIG. 22 is a cross-sectional view of a photo detection device in accordance with an exemplary embodiment of the disclosed technology, and FIG. 23 is a plan view of the photo detection device of FIG. 22.

The photo detection device 1010' of FIGS. 22 and 23 in accordance with the third exemplary embodiment of the disclosed technology is similar to that of the exemplary embodiment described with reference to FIGS. 16 and 17 except that a second electrode layer 1090' is formed at the bottom of a conductive substrate 1020' including GaN, ZnO, SiC, or GaAs.

Accordingly, the same elements as those shown in FIGS. 16 and 17 are assigned the same reference numerals, and a redundant description is omitted.

An example in which a photo detection package is configured using the photo detection device 1010' shown in FIGS. 22 and 23 is described below with reference to FIG. 24.

Figure 24:
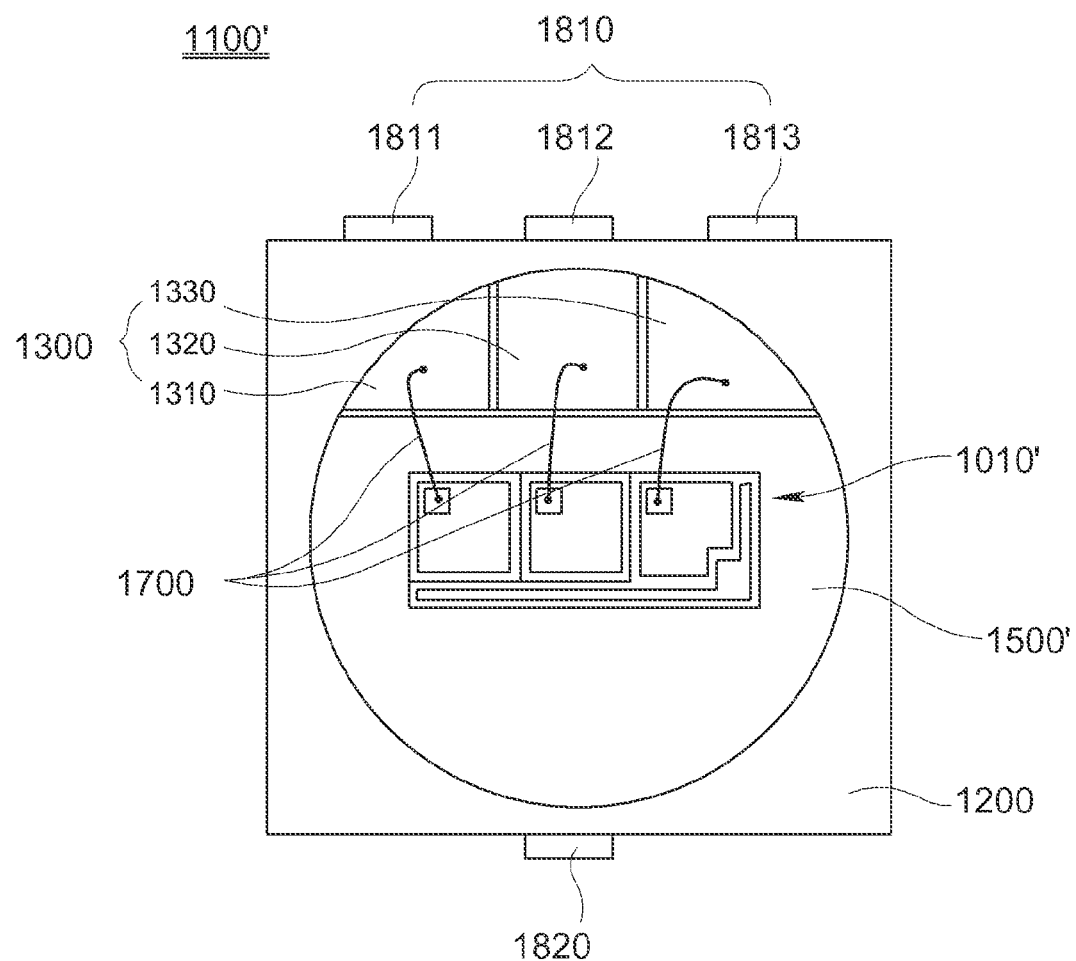
FIG. 24 is a plan view of a photo detection package of FIG. 23.

FIG. 24 is a plan view of a photo detection package in accordance with an exemplary embodiment of the disclosed technology.

The photo detection package 1100' of FIG. 24 in accordance with the exemplary embodiment of the disclosed technology is similar to that of the exemplary embodiment described with reference to FIG. 18 except that the photo detection device 1010' is directly mounted on a second electrode plate 1500' without the additional device contact plate 1400 (refer to FIG. 18) because the second electrode layer 1090' is formed at the bottom of the photo detection device 1010'.

Accordingly, the same elements as those shown in FIG. 18 are assigned the same reference numerals, and a redundant description is omitted.

A plurality of first electrode plates 1300 spaced apart from one another is formed on one side of the bottom surface of the depression unit 1210 of a lead frame 1200. The second electrode plate 1500' is formed on the other side of the bottom surface of the depression unit 1210 and is spaced apart from the plurality of first electrode plates 1300. As shown in FIGS. 22 and 23, the photo detection device 1010' in which the second electrode layer 1090' is formed at the bottom of the photo detection device 1010', that is, the bottom of the conductive substrate 1020', is mounted on the second electrode plate 1500'.

The (1-1), the (1-2), and the (1-3) electrode layers 1081, 1082, and 1083 of the photo detection device 1010' are electrically connected to the (1-1), the (1-2), and the (1-3) electrode plates 1310, 1320, and 1330 of the first electrode plates 1300, respectively, by bonding wires 1700. The second electrode layer 1090' of the photo detection device 1010' is electrically connected to the second electrode plate 1500' by contact.

Furthermore, a plurality of first lead wires 1810 including (1-1), (1-2), and (1-3) lead wires 1811, 1812, and 1813 is provided on one side of the lead frame 1200 so that the plurality of first lead wires 1810 is connected to external electrode lines and individually driven. A second lead wire 1820 is protruded and formed on the other side of the lead frame 1200.

The (1-1) lead wire 1811 is electrically connected to the (1-1) electrode plate 1310, the (1-2) lead wire 1812 is electrically connected to the (1-2) electrode plate 1320, the (1-3) lead wire 1813 is electrically connected to the (1-3) electrode plate 1330, and the second lead wire 1820 is electrically connected to the second electrode plate 1500'.

Accordingly, the light absorption layers can be individually driven by selectively supplying power to the light absorption layers through the first lead wires 1810.

A photo detection package in accordance with a fourth exemplary embodiment of the disclosed technology is described in detail below with reference to FIGS. 25 and 26.

Figure 25:
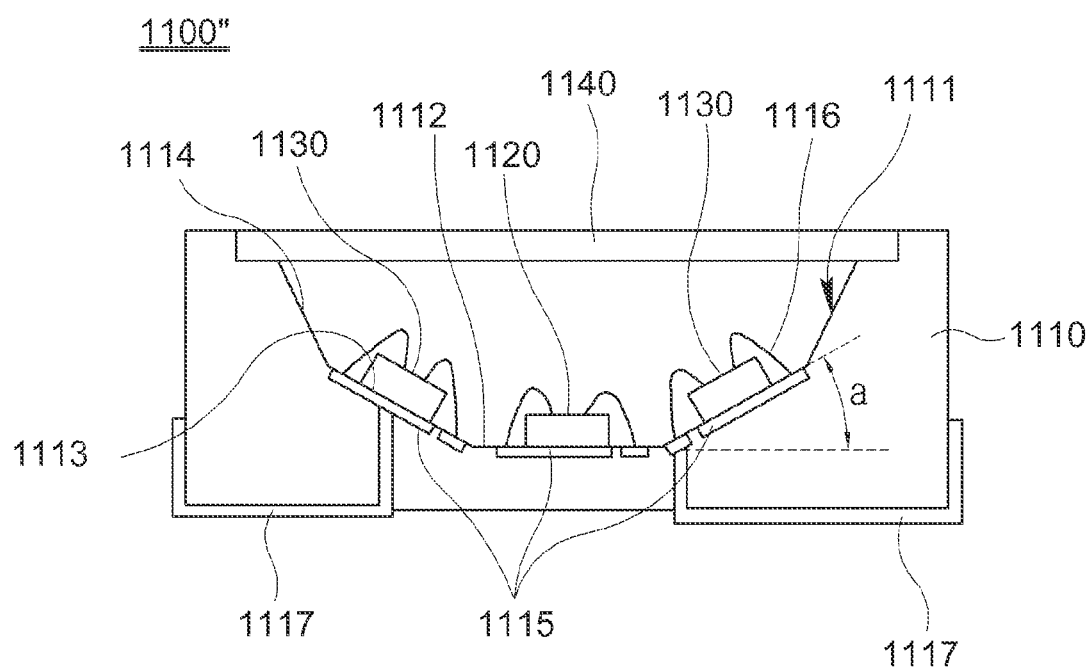
FIG. 25 is a cross-sectional view of a photo detection package in accordance with an exemplary embodiment of the disclosed technology.
Figure 26:
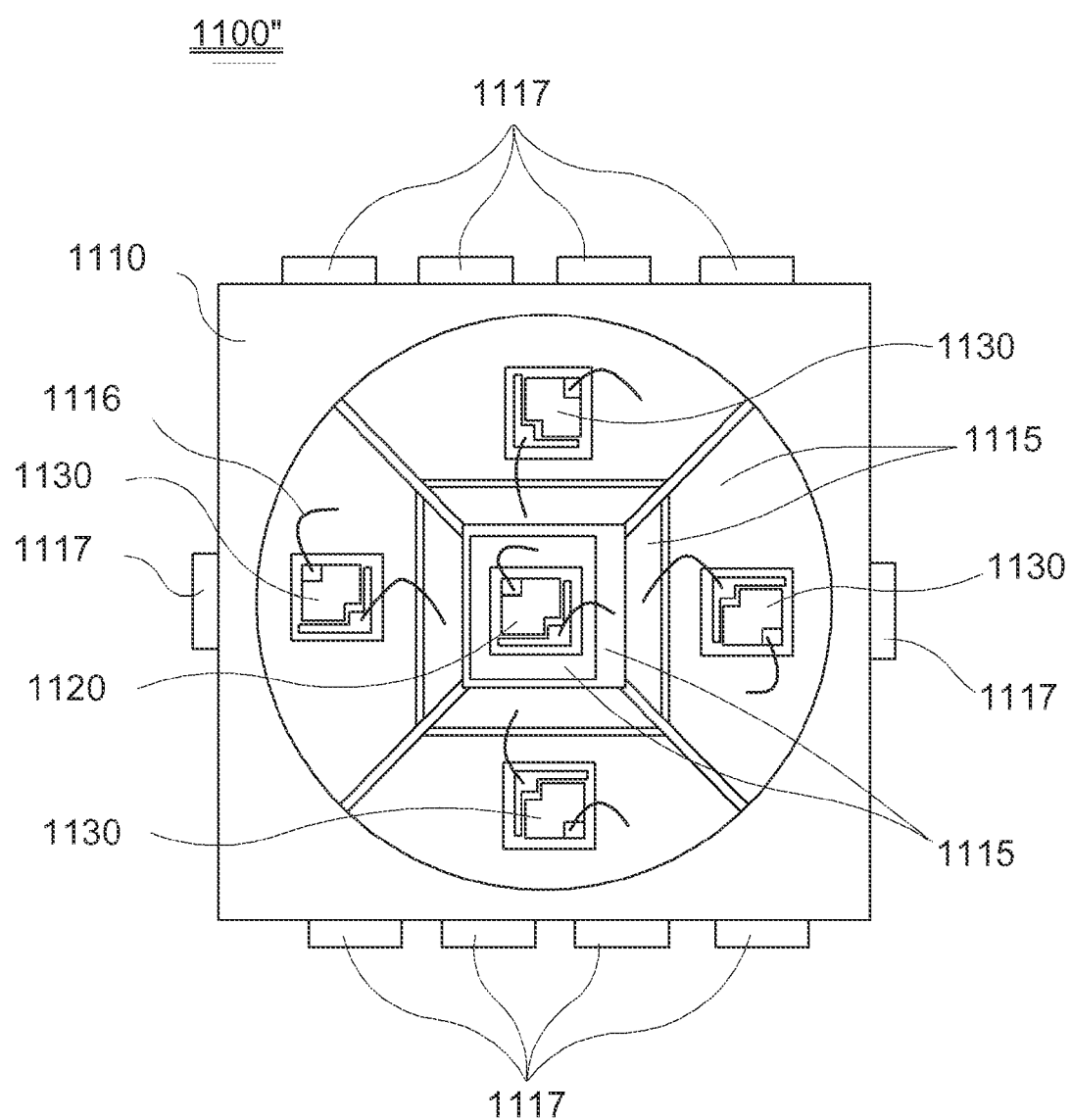
FIG. 26 is a plan view of the photo detection package shown in FIG. 25.

FIG. 25 is a cross-sectional view of the photo detection package in accordance with an exemplary embodiment of the disclosed technology, and FIG. 26 is a plan view of the photo detection package shown in FIG. 25.

The photo detection package 1100" in accordance with the exemplary embodiment of the disclosed technology may include a package body 1110 configured to have an upward opened groove unit 1111 formed therein, a photo detection device 1120 mounted on the bottom surface 1112 of the groove unit 1111 and electrically connected to the outside, and a Light-Emitting Diode (LED) 1130 mounted on the inner surface of the groove unit 1111 having an inclined surface on the periphery of the bottom surface 1112 and electrically connected to the outside.

The package body 1110 functions to support elements, such as the photo detection device 120 and the LED 130.

The upward opened groove unit 1111 is formed in the package body 1110. The bottom surface 1112, that is, the lowest bottom surface of the groove unit 1111, may have a flat surface. Furthermore, the inner surface of the groove unit 1111 that is formed on the periphery of the bottom surface 1112 is formed of an inclined surface.

The photo detection device 1120 is mounted on the bottom surface 1112 of the groove unit 1111. The photo detection device 1120 may be, for example, a UV photo detection device. The UV photo detection device may be fabricated by a Schottky type fabrication method using AlGaN, for example. The fabrication method is described in more detail with respect to the exemplary embodiments described above. Likewise, a GaN low-temperature buffer layer is grown on a sapphire substrate placed in a Metal Organic Vapor Phase Epitaxy (MOVPE) reaction chamber by supplying a Ga source and $NH_3$ gas at a temperature of about 550° C. Furthermore, a GaN high-temperature layer is grown by raising the temperature to about 1100° C. In order to prevent a crack, a high-temperature AlN layer is grown on the grown GaN high-temperature layer at a temperature of about 1100° C. An AlGaN layer is grown on the grown AlN layer as a light absorption layer. Metal, such as Ni, Pt, ITO, Pd, Au, or W, is deposited on the grown light absorption layer made of AlGaN so that the light absorption layer has a Schottky characteristic. Thereafter, the UV photo detection device can be fabricated by forming electrode layers.

The photo detection device and the method of fabricating the same are only examples. The photo detection device 1120 of the present embodiment may be a variety of photo detection devices from which electric currents are generated by absorbed light.

The photo detection device 1120 absorbs light, and thus an electric current flows through the photo detection device 1120. The amount of light is measured by detecting the current signal.

Internal electrodes 1115 may be formed in the bottom surface 1112 of the groove unit 1111 so that a current signal generated from the photo detection device 1120 can be transferred externally. The photo detection device 1120 may be connected to the internal electrodes 1115 through bonding wires 1116. Furthermore, the internal electrodes 1115 may be electrically connected to external electrodes 1117 formed in the package body 1110 so that the internal electrodes 1115 are exposed outside the package body 1110.

The LED 1130 is mounted on the inner surface of the groove unit 1111 on the periphery of the bottom surface 1112 on which the photo detection device 1120 has been mounted. The LED 1130 may be, for example, an Ultraviolet (UV) LED. In this case, UV light emitted from the UV LED may be used for sterilization, disinfection, and purification.

The LED 1130 is not limited to an UV LED, but may be various LEDs having a light-emission function.

If the LED 1130 is a UV LED, the photo detection device 1120 may be a UV photo detection device in accordance with the UV LED. Furthermore, the photo detection package 1100" includes the UV photo detection device and the UV LED, so the UV photo detection device can absorb UV emitted from the UV LED. Whether or not the UV photo detection device and the UV LED operate normally can be mutually checked through a monitoring process, as described in more detail below.

The LED 1130 may be mounted on an inclined surface of the package body 1110. In the present exemplary embodiment, the photo detection device 1120 is mounted on the bottom surface 1112. The inner surface of the groove unit 1111, that is, the periphery of the bottom surface 1112, may include a first inclined surface 1113 on which the LED 1130 is mounted. The reason why the LED 1130 is mounted on the inclined surface as described above includes a proper arrangement structure within the groove unit 1111. One of the grounds is to monitor whether or not the LED 1130 normally operate in a relationship with the photo detection device 120.

The inner surface of the groove unit 1111 may further include a second inclined surface 1114. The second inclined surface 1114 is an inner surface of the groove unit 1111 which is formed on the outer side from the first inclined surface 1113. If the first inclined surface 1113 is formed to have a gentle slope, the second inclined surface 1114 may have a greater tilt angle than the first inclined surface 1113 by taking a light absorption direction toward the photo detection device 1120, a light radiation direction from the LED 1130, and the concentration of the amount of light into consideration.

The internal electrodes 1115 may be formed in the inner surface of the groove unit 1111 so that the LED 130 is electrically connected to the outside. The LED 1130 and the internal electrodes 1115 may be coupled by the bonding wires 1116, and the internal electrode 1115 to which the LED 1130 is connected may be connected to an external electrode 1117 formed in the package body 1110.

The present exemplary embodiment may further include a package cover 1140 combined with the package body 1110 and configured to cover the opened top of the groove unit 1111.

The package cover 1140 can function to protect the aforementioned elements included in the groove unit 1111 from an external environment. The package cover 1140 may be formed of, for example, a quartz glass plate so that the absorption or dissipation of light is smooth. The package cover 1140 may be combined with the package body 1110 using various methods, such as a method of adhering the edge portion of the package cover 1140 to the upper part of the groove unit 1111.

The photo detection package 1100" according to the present exemplary embodiment has multi-purposes, such as a photo detection function and a photo discharge function (e.g., for lighting for sterilization) due to the aforementioned structural characteristic. Furthermore, the photo detection package 1100" may monitor whether or not the photo detection device 1120 and the LED 1130 operate normally. This is described in more detail below.

The photo detection device 1120 measures the amount of light by absorbing external light. Here, it is necessary to check whether or not the photo detection device 1120 operates normally, that is, whether or not the measured amount of light is accurate.

The photo detection package 1100" according to the present exemplary embodiment can measure the amount of light radiated from the LED 1130 mounted on the periphery of the photo detection device 1120 before the photo detection device 1120 measures the amount of external light and check whether or not the measurement value is within a predetermined normal range by comparing the measurement value with an initial input value. If, as a result of the comparison, the measurement value is found to be within the predetermined normal range, it may be determined that the photo detection device 1120 operates normally, and a measurement value for the amount of external light measured by the photo detection device 1120 may be reliable.

The LED 1130 is mounted on the first inclined surface 1113 included in the inner surface of the groove unit 1111 as described above such that the photo detection device 1120 can easily absorb light radiated from the LED 1130, in other words, a sufficient amount of light from the LED 1130 is directed toward the photo detection device 120. A tilt angle 'a' of the first inclined surface 1113 exceeds 0° and may be 50° or less so that the LED 1130 is easily mounted on the first inclined surface 1113.

If the LED 1130 does not operate normally, for example, the LED 1130 emits an amount of light smaller than an initial amount of light, it may be determined that one of the photo detection device 1120 and the LED 1130 abnormally operates. In order to determine that which one of the photo detection device 1120 and the LED 1130 abnormally operates more accurately, the present exemplary embodiment may include a plurality of LEDs 1130.

The plurality of LEDs 1130 is mounted on the first inclined surfaces 1113 included in the inner surface of the groove unit 1111. As shown, the plurality of LEDs 1130 may be spaced apart from one another at equal intervals on a concentric circle around the photo detection device 1120 placed on the bottom surface 1112. If the plurality of LEDs 1130 is mounted on the first inclined surfaces 1113, the plurality of LEDs 1130 does not need to be necessarily spaced apart from one another at equal intervals, and the first inclined surfaces 1113 included in the inner surface of the groove unit 1111 do not need to be necessarily spaced apart from one another at equal intervals on the circumference on the periphery of the bottom surface 1112.

According to the present exemplary embodiment, if the plurality of LEDs 1130 is included as described above, whether or not the LEDs 1130 and the photo detection device 1120 operate normally can be checked more accurately.

More particularly, whether or not a specific LED 1130 or a specific group of the LEDs 1130 operates normally can be checked in such a manner that the plurality of LEDs 1130 is sequentially driven one by one or two or more of possible combinations of the plurality of LEDs 1130 are sequentially driven and the photo detection device 1120 measures the amount of light radiated from the specific LED 1130 or the two or more groups and compares the measured amount of light with an initial input value. Furthermore, if a measurement value for each LED 1130 or a measurement value for each group is out of a normal range in relation to the initial input value, it may be determined that the photo detection device 1120 abnormally operates.

Although not shown, the present exemplary embodiment may further include a signal processing unit for processing the measured light amount value, the comparison and determination of the measured light amount value and the initial input value, and corresponding processing.

Figure 27:
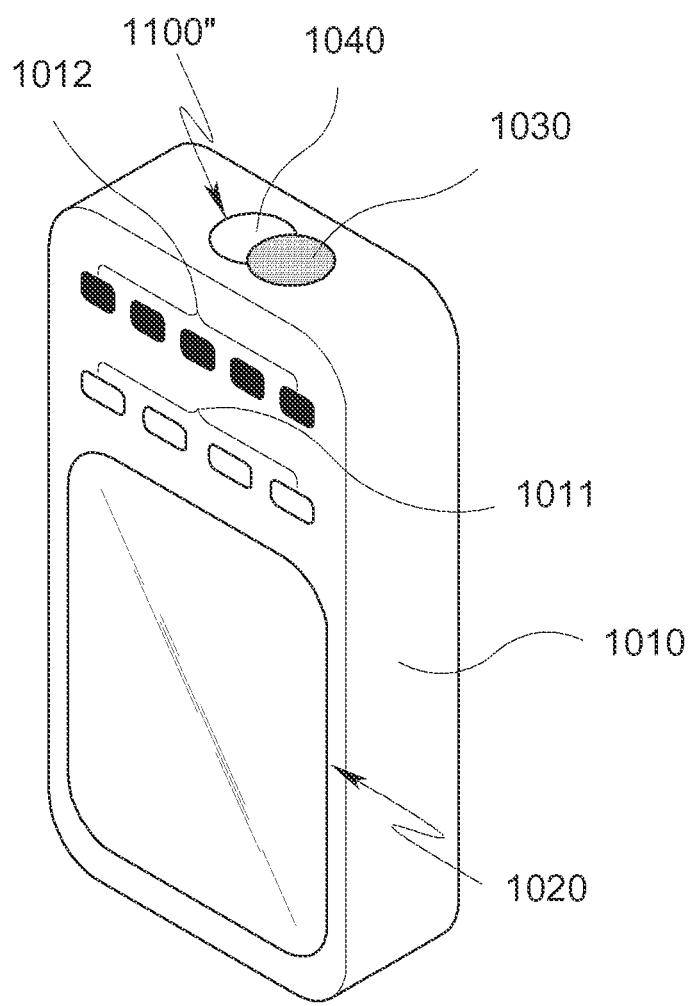
FIG. 27 is a perspective view of a portable device including the photo detection package in accordance with an exemplary embodiment of the disclosed technology.

A portable device including the photo detection package in accordance with an exemplary embodiment of the disclosed technology is described in detail below with reference to FIG. 27. A package included in the present exemplary embodiment may be the photo detection package 1100, 1100', or 1100". In FIG. 27, the elements of the package included in the present exemplary embodiment are assigned the same reference numerals as those of the photo detection package 1200" in accordance with the exemplary embodiment, and a detailed description thereof is omitted.

FIG. 27 is a perspective view of a portable device including the photo detection package in accordance with an exemplary embodiment of the disclosed technology.

The portable device 1901 according to the present exemplary embodiment may include a main body unit 1910, a package 1100" mounted on the main body unit 1910, and a display unit 1920 formed in the main body unit 1910 and configured to display information according to an operation of the photo detection device 1120 or the LED 1130.

The main body unit 1910 functions to support elements disposed in the main body unit 1910, such as the package 1100" and the display unit 1920. Although not shown, the signal processing unit may be embedded in the main body unit 1910 and parts, such as a power supply unit, may be included in the main body unit 1910.

As shown in FIG. 27, the main body unit 1910 having a rectangular parallelepiped shape is illustrated, but the main body unit 1910 is not limited to the rectangular parallelepiped shape. The main body unit 1910 may have a variety of other shapes in which portable convenience has been taken into consideration.

The package 1100" is mounted on the main body unit 1910. For example, as shown in FIG. 27, the package 1100" may be buried at the top of the main body unit 1910. Although not shown, the package 1100" may be mounted on various positions, such as the front surface, rear surface, left side, right side, or bottom surface of the main body unit 1910 in such a way as to be buried or protruded.

The opened top direction of the groove unit 1111 of the package 1100", that is, a surface, in the direction in which light is absorbed or discharged, that is a portion on the package cover (140) side, is externally exposed in the state in which the package 1100" has been mounted on the main body unit 1910. The present exemplary embodiment may further include a main body unit cover 1930 combined with the main body unit 1910 and configured to open or close the exposed portion of the package 1100".

The main body unit cover 1930 can function to protect the package 1100" from an external environment.

Furthermore, the main body unit cover 1930 may participate in a mutual monitoring process between the photo detection device 1120 and the LED 1130 included in the package 1100". A material layer (not shown) for performing total reflection on light may be formed in one surface of the main body unit cover 1930 which faces a portion of the package 1100" which is externally exposed. The material layer including, for example, Al materials may be coated on one surface of the main body unit cover 1930 using various methods.

If the material layer is formed on one surface of the main body unit cover 1930 as described above, light discharged from the LED 1130 can be reflected from the material layer and easily directed toward the photo detection device 1120. Accordingly, although the first inclined surface 1113 on which the LED 1130 is mounted has a gentle inclined surface in which the ease of assembly is taken into consideration, the photo detection device 1120 can absorb a sufficient amount of light that is necessary for measurement through the reflection of light in the material layer.

The display unit 1920 functions to externally display information according to an operation of the package 1100", that is, information according to an operation of the photo detection device 1120 or the LED 1130.

More particularly, the signal processing unit can obtain information about the amount of light, for example, UV information, such as a UV index, by converting an analog signal received from the photo detection device 1120 into a digital signal. Such information can be displayed on the display unit 1920. Here, supplementary information corresponding to information about the amount of light may also be displayed. For example, if a UV index is displayed, information, such as a warning or measures corresponding to the UV index, may also be displayed.

Furthermore, if the LED 1130 is an UV LED, for example, and sterilization, purification, or disinfection using the LED 1130 is performed, information about contents that call attention so that the a user's body is not exposed to UV emitted from the UV LED or an operation time may be displayed on the display unit 1920.

In addition to the information according to the natural functions of the photo detection device 1120 and the LED 1130, information about a result of monitoring regarding whether or not the photo detection device 1120 and the LED 1130 operate normally may also be displayed on the display unit 1920.

The present exemplary embodiment may further include a function button unit 1911 formed in the main body unit 1910. The function button unit 1911 may be configured to perform specific functions in relation to the package 1100" or the display unit 1920. For example, the function button unit 1911 may include a reset button and a power ON/OFF button. The portable device 1901 according to the present exemplary embodiment may have improved convenience according to the function button unit 1911.

The present exemplary embodiment may further include a color display unit 1912 formed in the main body unit 1910 so that a user can easily check information about the amount of light. If the photo detection device 1120 is, for example, a UV photo detection device, the color display unit 1912 may display a specific color in response to UV information detected by the photo detection device 1120. The specific color may be, for example, green, yellow, orange, red, and purple according to the 5-step classification of an UV index. The color display unit 1912 may be formed of one color display unit for displaying a specific color or may be formed of a plurality of color display units for displaying respective colors as shown in FIG. 27.

A portable device including the photo detection package in accordance with another exemplary embodiment of the disclosed technology is described below with reference to the accompanying drawings. A portable device 1902 of the present exemplary embodiment differs from the portable device 1901 of the previous exemplary embodiment in some elements, and only a difference between the present exemplary embodiment and the previous exemplary embodiment is described in detail.

Figure 28:
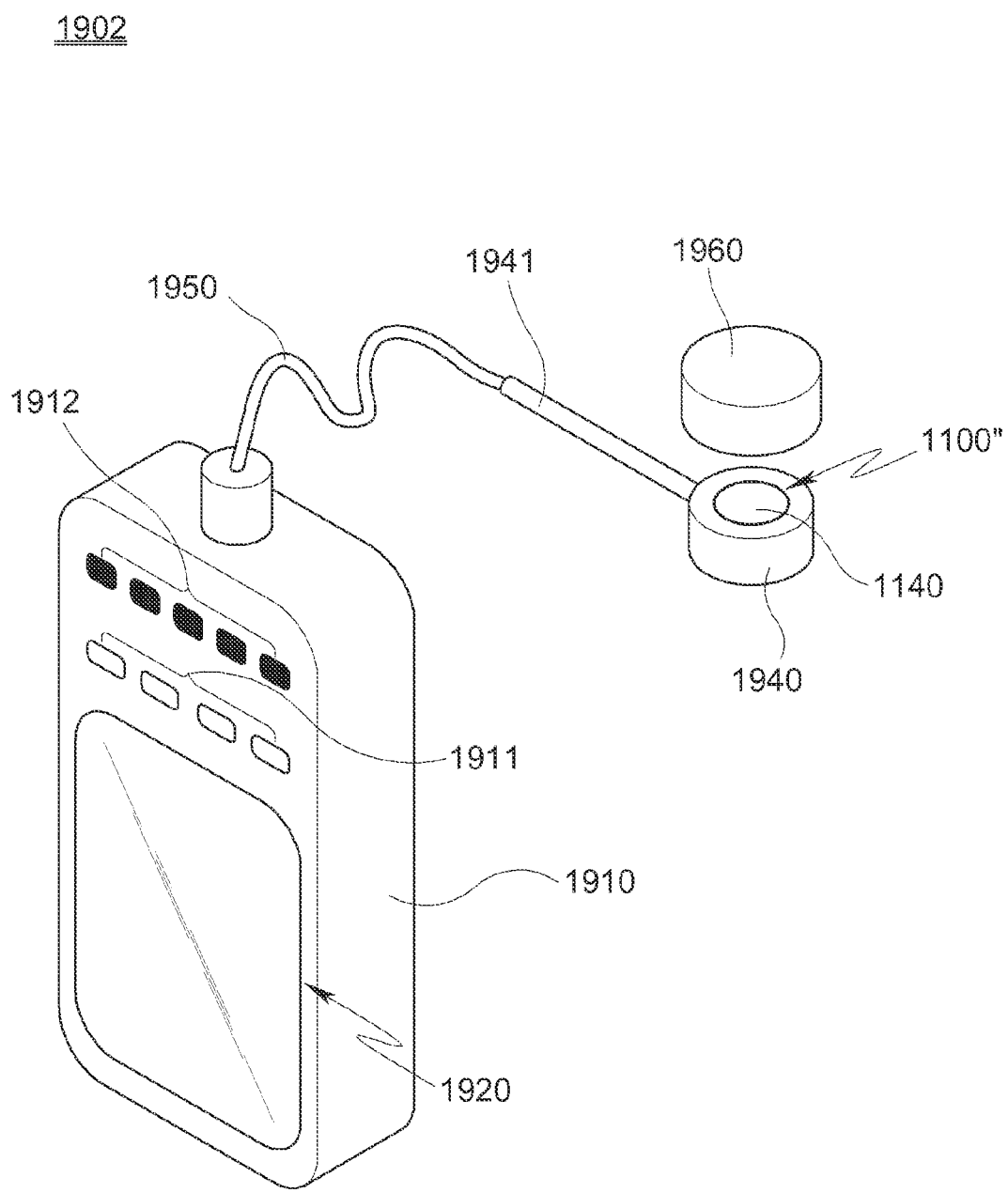
FIG. 28 is a perspective view of a portable device including the photo detection package in accordance with an exemplary embodiment of the disclosed technology.

FIG. 28 is a perspective view of a portable device including the photo detection package in accordance with another exemplary embodiment of the disclosed technology.

The portable device 1902 according to the present exemplary embodiment may include a main body unit 1910, a mounting unit 1940 configured to have the package 1100" mounted thereon, a signal transfer line 1950 extended from the mounting unit 1940, connected to the main body unit 1910, and configured to electrically connect the package 1100" and the main body unit 1910, and a display unit 1920 formed in the main body unit 1910 and configured to display information according to an operation of the photo detection device 1120 or the LED 1130.

The portable device 1902 according to the present exemplary embodiment is different from the portable device 1901 according to the aforementioned exemplary embodiment in that the package 1100" is not directly mounted on the main body unit 1910, but is mounted on the additional mounting unit 1940.

The mounting unit 1940 functions to support the package 1100" mounted thereon. The package cover 1140 of the package 1100" mounted on the mounting unit 1940 is externally exposed. The present exemplary embodiment may further include a mounting unit cover 1960 combined with the mounting unit 1940 and configured to open or close a portion of the package 1100" which is externally exposed.

The mounting unit cover 1960 performs the same function as the main body unit cover 1930. A material layer (not shown) having the same function as the aforementioned material layer and including the same materials as those of the aforementioned material layer may be formed in one surface of the mounting unit cover 1960 which faces the externally exposed portion of the package 1100".

A handle unit 1941 may be formed on one side of the mounting unit 1940 by taking use convenience into consideration. For example, the handle unit 1941 protruded from the side of the mounting unit 1940 may be formed as shown in FIG. 28, and a user can easily place the mounting unit 1940 at a desired position or in a desired direction using the handle unit 1941. Furthermore, if UV light is to be measured, a body part, such as a hand, can be placed far from a measurement position using the handle unit, thereby being capable of reducing a danger that the body is exposed to the UV light.

The present exemplary embodiment includes the signal transfer line 1950 for electrically connecting the package 1100" and the main body unit 1910 because the package 1100" is mounted on the additional mounting unit 1940.

The signal transfer line 1950 may be electrically connected to the external electrodes 1117 (refer to FIG. 25) of the package 1100" and is extended from the mounting unit 1940 and connected to the main body unit 1910.

A signal processing unit (not shown) that may be included in the main body unit 910 processes signals received through the signal transfer line 1950. Furthermore, a power supply unit that may be included in the main body unit 1910 can supply power to the package 1100" through the signal transfer line 1950.

In accordance with the exemplary embodiments of the disclosed technology, different wavelength regions of two or more regions can be detected in one device because the first electrode layer is formed in each of the plurality of light absorption layers capable of detecting different wavelength regions and the plurality of light absorption layers can operate individually.

Furthermore, reliability of a product can be improved because an accurate reactivity value according to a wavelength can be obtained without increasing a reverse bias value.

Furthermore, a photo detection package having both a light detection function and a light dissipation function and capable of realizing a simple structure if both a photo detection device and an LED are included in one package and a portable device including the photo detection package are provided.

Furthermore, whether or not a photo detection device and an LED operate normally can be monitored mutually because a photo detection package is configured to include the photo detection device capable of absorbing light emitted from the LED, and thus reliability of a product can be secured.

The features disclosed above can be combined in various combinations and the specific examples described above cover only certain combinations. Other combinations can also be made. While the disclosed technology has been described with respect to the specific embodiments, it will be apparent to those skilled in the art that various changes and modifications may be made.

What is claimed is:

1. A light detection device comprising:
   a substrate;
   a buffer layer disposed over the substrate;
   a first band gap change layer disposed over a portion of the buffer layer;
   a light absorption layer disposed over the first band gap change layer;
   a Schottky layer disposed over a portion of the light absorption layer; and
   a top layer disposed between the light absorption layer and the Schottky layer, and
   wherein the light absorption layer has an energy band gap higher than that of the buffer layer and the first band gap change layer has multiple layers each having different Al contents such that the layers of the first band gap change layer have an increasing energy band gap towards the light absorption layer and the top layer has an energy band gap higher than that of the light absorption layer.

2. The light detection device of claim 1, further comprising a Schottky fixing layer disposed over the Schottky layer to cover the Schottky layer.

3. The light detection device of claim 1, wherein the Schottky layer comprises ITO, ATO, Pt, W, Ti, Pd, Ru, Cr, or Au and the Schottky fixing layer comprises ITO, ATO, Pt, W, Ti, Pd, Ru, Cr, or Au.

4. The light detection device of claim 1, further comprising:
   a first electrode layer disposed over the Schottky fixing layer; and
   a second electrode layer disposed on the buffer layer and spaced apart from the first band gap change layer, the second electrode layer configured to form an Ohmic junction with the buffer layer.

5. The light detection device of claim 1, wherein the substrate comprises a sapphire substrate, an SiC substrate, a GaN substrate, an AlN substrate, or an Si substrate.

6. The light detection device of claim 1, wherein the buffer layer comprises a low-temperature GaN layer disposed over the substrate and a high-temperature GaN layer disposed over the low-temperature GaN layer.

7. The light detection device of claim 1, wherein the multiple layers comprises AlGaN layers.

8. The light detection device of claim 1, wherein the light absorption layer has an energy band gap higher than that of the buffer layer.

9. The light detection device of claim 1, wherein the light absorption layer comprises $Al_xGa_{1-x}N$ ($0<x<0.7$) or $In_yGa_{1-y}N$ ($0<y<0.5$).

10. The light detection device of claim 1, wherein the first band gap change layer comprises InGaN layers having different In contents.

11. The light detection device of claim 1, wherein the first band gap change layer has a thickness between 0 and 50 nm.

12. The light detection device of claim 1, wherein the light absorption layer has a thickness between 0.1 to 0.5 μm.

13. A light detection device, comprising:
   a body;
   first and second electrodes formed in the body and separated from each other; and
   a light-emitting diode formed on a first substrate and electrically connected with the first electrode, the light-emitting diode operable to emit light;
   a photo detection structure formed on a second substrate spaced apart from the first substrate and electrically connected with the second electrode, the photo detection structure located to detect the emitted light from the light-emitting diode.

14. The light detection device of claim 13, the photo detection structure exhibits a particular reactivity in the absorption layer.

15. The light detection device of claim 13, wherein the body has a groove formed in the body and having a curved shape and the first and second electrodes are formed on a surface of the groove.

16. The light detection device of claim 13, further comprising a cover detachably combined with the body.

* * * * *